US008659944B2

(12) United States Patent
Hung et al.

(10) Patent No.: US 8,659,944 B2
(45) Date of Patent: Feb. 25, 2014

(54) MEMORY ARCHITECTURE OF 3D ARRAY WITH DIODE IN MEMORY STRING

(75) Inventors: Chun-Hsiung Hung, Hsinchu (TW); Shin-Jang Shen, Jhubei (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 77 days.

(21) Appl. No.: 13/011,717

(22) Filed: Jan. 21, 2011

(65) Prior Publication Data

US 2012/0051137 A1 Mar. 1, 2012

Related U.S. Application Data

(60) Provisional application No. 61/379,297, filed on Sep. 1, 2010, provisional application No. 61/434,685, filed on Jan. 20, 2011.

(51) Int. Cl.
*G11C 16/04* (2006.01)
*G11C 16/06* (2006.01)

(52) U.S. Cl.
USPC ............. 365/185.17; 365/185.05; 365/185.18

(58) Field of Classification Search
USPC ............. 365/185.17, 185.28, 185.18, 185.33, 365/230.06, 63, 185.01, 185.14, 185.05, 365/185.02
See application file for complete search history.

(56) References Cited

U.S. PATENT DOCUMENTS

| | | | |
|---|---|---|---|
| 5,912,489 A * | 6/1999 | Chen et al. ............... | 257/321 |
| 6,034,882 A | 3/2000 | Johnson et al. | |
| 6,906,361 B2 | 6/2005 | Zhang | |
| 6,906,940 B1 | 6/2005 | Lue | |
| 7,005,350 B2 * | 2/2006 | Walker et al. ............... | 438/268 |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |

(Continued)

FOREIGN PATENT DOCUMENTS

| | | |
|---|---|---|
| CN | 1759482 A | 4/2006 |
| EP | 1936681 A1 | 6/2008 |
| EP | 2048709 A2 | 4/2009 |

OTHER PUBLICATIONS

Erh-Kun Lai et al. "A Multi-Layer Stackable Thin-Film Transistor (TFT) NAND-Type Flash Memory," IEDM Aug. 2006, consisting of 4 pages.

(Continued)

*Primary Examiner* — Toan Le
(74) *Attorney, Agent, or Firm* — Kenta Suzue; Haynes Beffel & Wolfeld LLP

(57) ABSTRACT

A 3D memory device includes a plurality of ridge-shaped stacks, in the form of multiple strips of conductive material separated by insulating material, arranged as strings which can be coupled through decoding circuits to sense amplifiers. Diodes are connected to the bit line structures at either the string select of common source select ends of the strings. The strips of conductive material have side surfaces on the sides of the ridge-shaped stacks. A plurality of conductive lines arranged as word lines which can be coupled to row decoders, extends orthogonally over the plurality of ridge-shaped stacks. Memory elements lie in a multi-layer array of interface regions at cross-points between side surfaces of the conductive strips on the stacks and the conductive lines.

24 Claims, 33 Drawing Sheets

(56) References Cited

U.S. PATENT DOCUMENTS

| | | | |
|---|---|---|---|
| 7,382,647 | B1 | 6/2008 | Gopalakrishnan |
| 7,420,242 | B2 | 9/2008 | Lung |
| 7,851,849 | B2 | 12/2010 | Kiyotoshi |
| 2004/0124466 | A1 | 7/2004 | Walker et al. |
| 2005/0280061 | A1 | 12/2005 | Lee |
| 2007/0140001 | A1 | 6/2007 | Motoi et al. |
| 2007/0253233 | A1* | 11/2007 | Mueller et al. ............ 365/51 |
| 2008/0048237 | A1* | 2/2008 | Iwata .................... 257/314 |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0106931 | A1* | 5/2008 | Toda ..................... 365/163 |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0097321 | A1 | 4/2009 | Kim et al. |
| 2009/0184360 | A1 | 7/2009 | Jin et al. |
| 2010/0226195 | A1* | 9/2010 | Lue .................. 365/230.06 |
| 2010/0270593 | A1 | 10/2010 | Lung et al. |
| 2011/0069524 | A1* | 3/2011 | Toba et al. ............... 365/63 |
| 2011/0292738 | A1* | 12/2011 | Hsu et al. ............ 365/185.28 |

OTHER PUBLICATIONS

H. Tanaka et al. "Bit Cost Scalable Technology With Punch and Plug Process for Ultra High Density Flash Memory," 2007 IEEE Symposium on VLSI Technology Digest of Technical Papers, Jun. 12-14, 2007, pp. 14-15.

Soon-Moon Jung et al. "Three Dimensionally Stacked NAND Flash Memory Technology Using Stacking Single Crystal Si Layers on ILD and TANOS Structure for Beyond 30nm Node," Electron Devices Meeting, 2006 IEDM '06 International Dec. 11-13, 2006, pp. 1-4.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Jiyoung Kim et al. "Novel 3-D Structure for Ultra High Density Flash Memory with VRAT (Vertical-Recess-Array-Transistor) and PIPE (Planarized Integration on the same Plan E)," 2008 Symposium on VLSI Technology Digest of Technical Papers, pp. 122-123.

Jan. 29, 2013 Office Action in related application CN 2011 10189096, 6pp.

U.S. Appl. No. 13/363,014, filed Jan. 31, 2012 entitled "Memory Architecture of 3D Array with Diode in Memory String,".

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

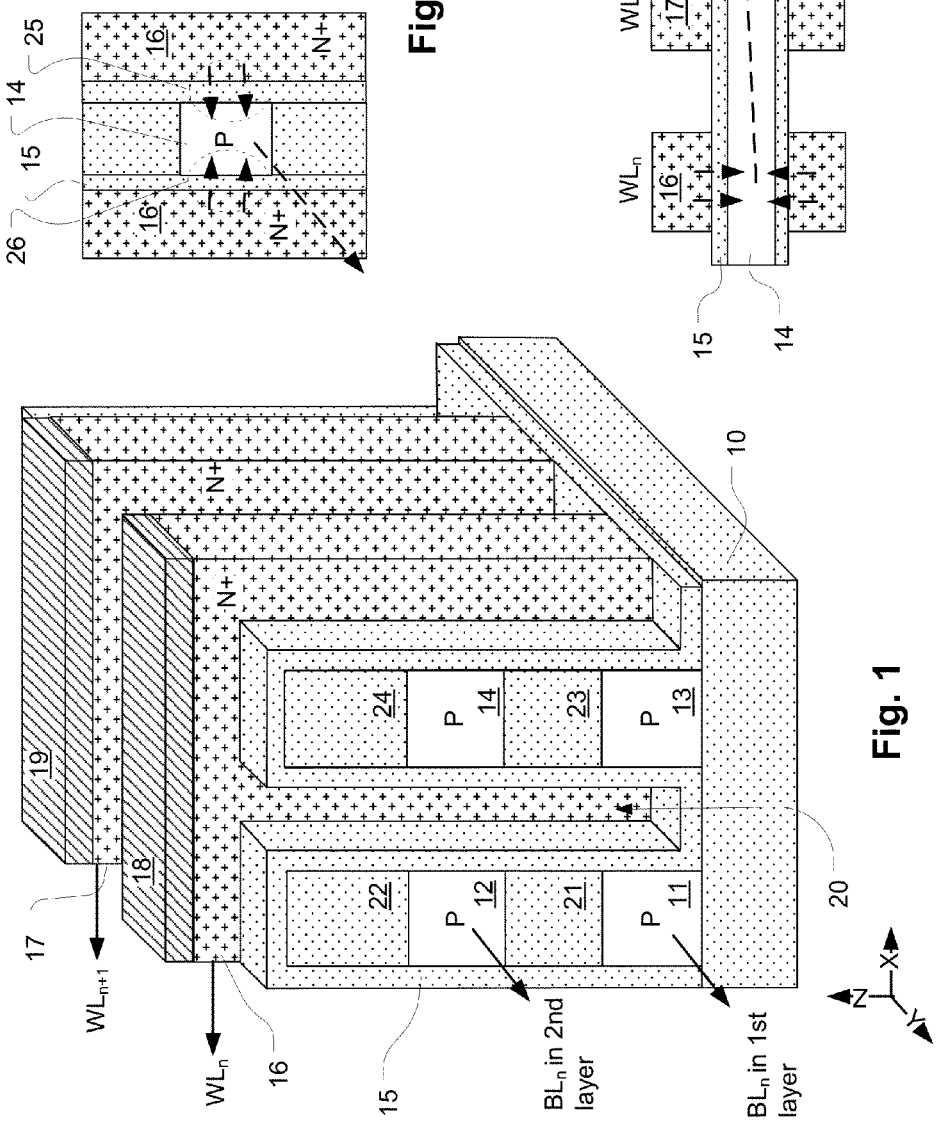

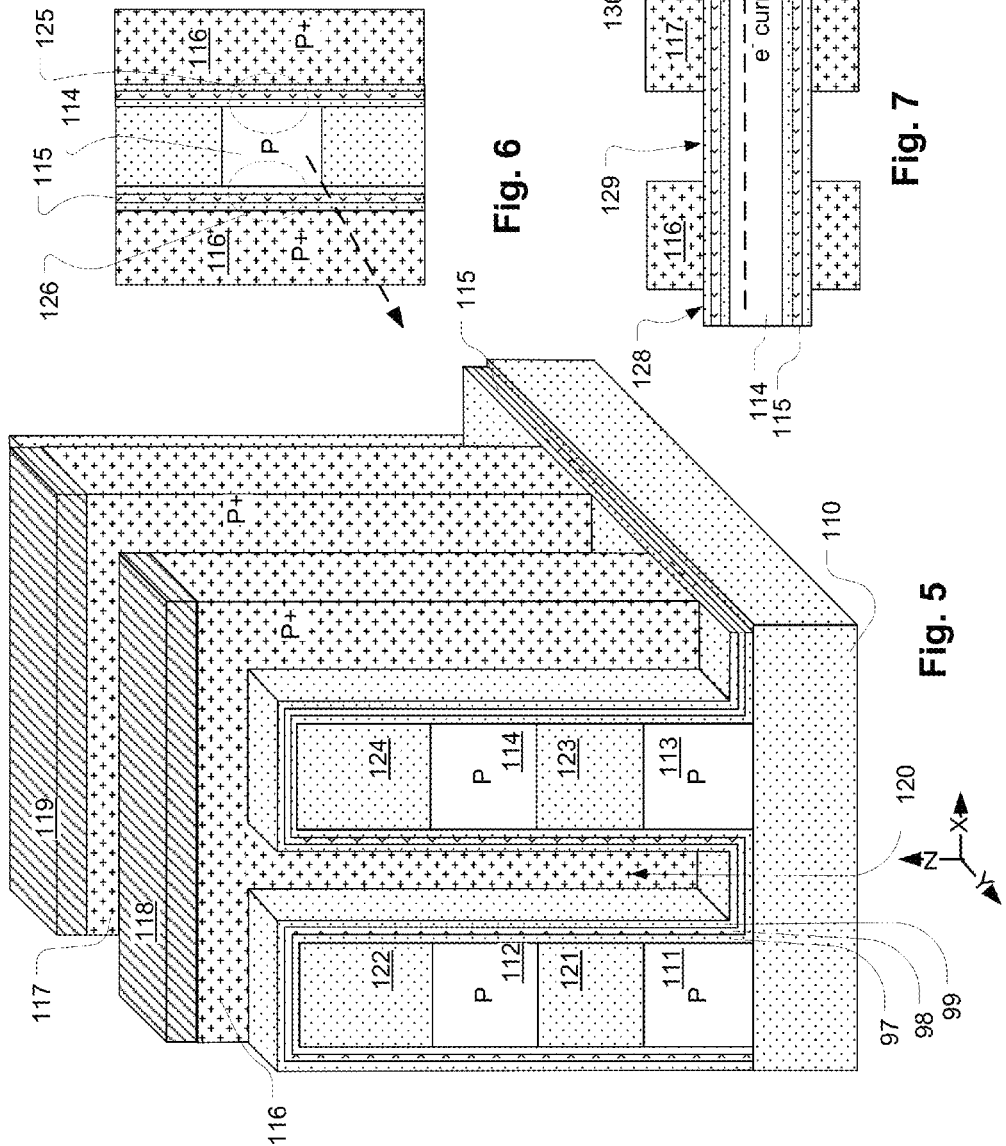

SL SIDE DIODE
1ST PROGRAM
SEQUENCE

SL SIDE DIODE
2ND PROGRAM
SEQUENCE

MEMORY ARCHITECTURE OF 3D ARRAY WITH DIODE IN MEMORY STRING

RELATED APPLICATIONS

This application claims the benefit of U.S. Provisional Application No. 61/379,297, filed on 1 Sep. 2010 and U.S. Provisional Application No. 61/434,685, filed on 20 Jan. 2011. Both applications are incorporated herein by reference.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements.

SUMMARY OF THE INVENTION

One aspect is a memory device, comprising integrated circuit substrate, a plurality of stacks of semiconductor material strips, a plurality of word lines, memory elements and diodes. The plurality of stacks of semiconductor material strips extend out of the integrated circuit substrate. The plurality of stacks are ridge-shaped and include at least two semiconductor material strips separated by insulating material into different plane positions of a plurality of plane positions. The plurality of word lines are arranged orthogonally over, and have surfaces conformal with, the plurality of stacks, such that a 3D array of interface regions is established at cross-points between surfaces of the plurality of stacks and the plurality of word lines. The memory elements in the interface regions, establish a 3D array of memory cells accessible via the plurality of semiconductor material strips and the plurality of word lines. The memory cells are arranged in strings between bit line structures and source lines. The diodes are coupled to the strings, between the strings of memory cells and one of the bit line structures and the source lines.

In some embodiments the strings are NAND strings.

In some embodiments a combined selection of a particular bit line of the bit line structures, a particular source line of the source lines, and a particular word line of the plurality of word lines, identifies a particular memory cell of the 3D array of memory cells.

In some embodiments the diodes are coupled to the strings, between the strings of memory cells and the bit line structures.

In some embodiments the diodes are coupled to the strings, between the strings of memory cells and the source lines.

Some embodiments include a string select line and a ground select line. The string select line is arranged orthogonally over, and has surfaces conformal with, the plurality of stacks, such that the string select devices are established at cross-points between surfaces of the plurality of stacks and the string select line. The ground select line is arranged orthogonally over, and has surfaces conformal with, the plurality of stacks, such that the ground select devices are established at cross-points between surfaces of the plurality of stacks and the ground select line.

In some embodiments the diodes are coupled between the string select devices and the bit line structures. In some embodiments the diodes are coupled between the ground select devices and the source lines.

In some embodiments the charge trapping structures in the interface regions respectively comprise a tunneling layer, a charge trapping layer and a blocking layer.

In some embodiments the semiconductor strips comprise n-type silicon, and the diodes comprise a p-type region in the strips. In some embodiments the semiconductor strips comprise n-type silicon, and the diodes comprise a p-type plug in contact with the strips.

Some embodiments include logic to reverse bias the diodes of unselected strings of memory cells during programming of the memory cells.

One aspect is memory device, comprising an integrated circuit substrate, and a 3D array of memory cells on the integrated circuit substrate. The 3D array includes stacks of NAND strings of memory cells; and diodes coupled to the strings, between the strings of memory cells and one of the bit line structures and the source lines.

In some embodiments a combined selection of a particular bit line of the bit line structures, a particular source line of the source lines, and a particular word line of the plurality of word lines, identifies a particular memory cell of the 3D array of memory cells.

In some embodiments the diodes are coupled to the strings, between the strings of memory cells and the bit line structures. In some embodiments the diodes are coupled to the strings, between the strings of memory cells and the source lines.

Some embodiments include string select devices between the bit line structures and the strings of memory cells, and ground select devices between the source lines and the strings of memory cells.

In some embodiments the diodes are coupled between the string select devices and bit line structures. In some embodiments the diodes are coupled between the ground select devices and source lines.

In some embodiments the charge trapping structures in the interface regions respectively comprise a tunneling layer, a charge trapping layer and a blocking layer.

One aspect is a method of operating a 3D NAND flash memory. The step include, applying a program bias arrangement sequence to the 3D NAND flash memory having diodes coupled to the strings such that the diodes are between strings of memory cells and one of bit line structures and source line structures.

One or more of the unselected strings are charged, wherein the unselected strings do not include memory cells to be programmed by the program bias arrangement. In various embodiments, the charging is from the source line structure or from the bit line structures. In various embodiments, the charging is through the diodes or not through the diodes. The source line structures and the bit line structures are decoupled from the unselected strings and a selected string including one or more memory cells to be programmed by the program bias arrangement. A program voltage is applied via one or more word lines of the one or more memory cells to be programmed by the program bias arrangement, to the unselected strings and the selected string.

The memory elements arranged in strings between corresponding bit line structures and common source lines, and including diodes coupled to respective strings between the strings of memory cells and one of the bit line structures and common source lines. First select gates (e.g. SSL) can be coupled between the corresponding bit line structures and strings of memory cells, and second select gates (e.g. CSL) can be coupled between the corresponding common source lines and strings of memory cells. The diodes can coupled between the first select gates and the corresponding bit line structures. The diodes can be coupled between the second select gates and the corresponding common source lines.

The 3D memory device includes a plurality of ridge-shaped stacks, in the form of multiple strips of semiconductor material separated by insulating material, arranged in the examples described herein as strings which can be coupled through decoding circuits to sense amplifiers. The strips of semiconductor material have side surfaces on the sides of the ridge-shaped stacks. A plurality of conductive lines arranged in the examples, described herein as word lines which can be coupled to row decoders, extends orthogonally over the plurality of ridge-shaped stacks. The conductive lines have surfaces (e.g. bottom surfaces) that conform to the surface of the stacks. This conformal configuration results in a multi-layer array of interface regions at cross-points between side surfaces of the semiconductor material strips on the stacks and the conductive lines. Memory elements lie in the interface regions between the side surfaces of the strips and the conductive lines. The memory elements are programmable, like the programmable resistance structures or charge trapping structures in the embodiments described below. The combination of the conformal conductive line, the memory element and the semiconductor material strips within a stack at particular interface regions forms a stack of memory cells. As a result of the array structure, a 3D array of memory cells is provided.

The plurality of ridge-shaped stacks and the plurality of conductive lines can be made so that the memory cells are self-aligned. For example, the plurality of semiconductor material strips in the ridge-shaped stack can be defined using a single etch mask, resulting in formation of alternating trenches, which can be relatively deep, and stacks in which the side surfaces of the semiconductor material strips are vertically aligned or aligned on tapered sides of the ridges that result from the etch. The memory elements can be formed using a layer or layers of material made with blanket deposition processes over the plurality of stacks, and using other processes without a critical alignment step. Also, the plurality of conductive lines can be formed using a conformal deposition over the layer or layers of material used to provide the memory elements, followed by an etch process to define the lines using a single etch mask. As a result, a 3D array of self-aligned memory cells is established using only one alignment step for the semiconductor material strips in the plurality of stacks, and one alignment step for the plurality of conductive lines.

Also described herein is a 3D, buried-channel, junction-free NAND flash structure based on BE-SONOS technology.

This invention is to provide a very efficient array decoding method for 3D VG NAND Flash design. The die size can fit the current FG NAND Flash design while the density can be extended to 1T bit.

This patent proposal provides a practical circuit design architecture for ultra high density 3D NAND Flash.

Other aspects and advantages of the present invention can be seen on review of the drawings, the detailed description and the claims, which follow.

BRIEF DESCRIPTION OF THE DRAWINGS

FIG. 1 is a perspective illustration of a 3D memory structure as described herein including a plurality of planes of semiconductor material strips parallel to a Y-axis, arranged in a plurality of ridge-shaped stacks, a memory layer on side surfaces of the semiconductor material strips, and a plurality of conductive lines with conformal bottom surfaces arranged over the plurality of ridge-shaped stacks.

FIG. 2 is a cross-section of a memory cell taken in the X-Z plane from the structure of FIG. 1.

FIG. 3 is a cross-section of a memory cell taken in the X-Y plane from the structure of FIG. 1.

FIG. 5 is a perspective illustration of a 3D NAND-flash memory structure as described herein including a plurality of planes of semiconductor material strips parallel to a Y-axis, arranged in a plurality of ridge-shaped stacks, a charge trapping memory layer on side surfaces of the semiconductor material strips, and a plurality of conductive lines with conformal bottom surfaces arranged over the plurality of ridge-shaped stacks.

FIG. 6 is a cross-section of a memory cell taken in the X-Z plane from the structure of FIG. 5.

FIG. 7 is a cross-section of a memory cell taken in the X-Y plane from the structure of FIG. 5.

DETAILED DESCRIPTION

Figure 4:
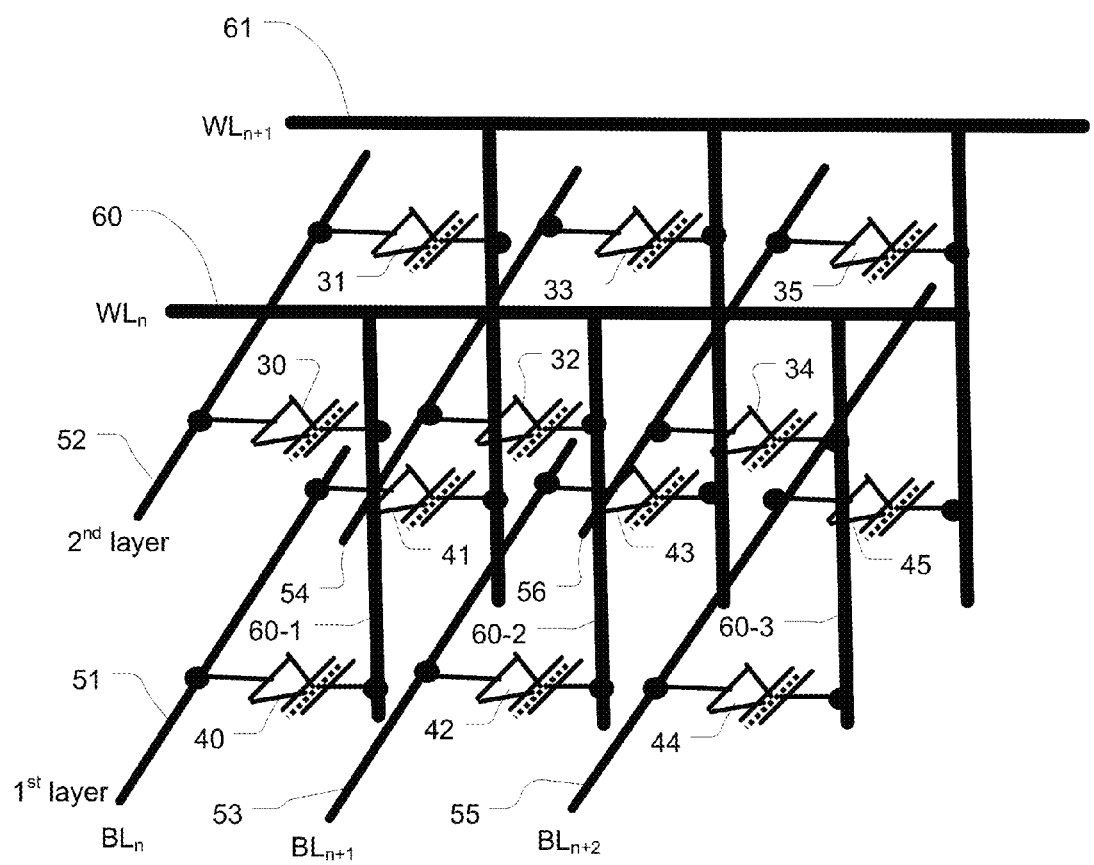
FIG. 4 is a schematic diagram of an anti-fuse based memory having the structure of FIG. 1.

A detailed description of embodiments is provided with reference to the Figures.

FIG. 1 is a perspective drawing of a 2×2 portion of a three-dimensional programmable resistance memory array with fill material removed from the drawing to give a view of the stacks of semiconductor material strips and orthogonal conductive lines that make up the 3D array. In this illustration, only 2 planes are shown. However, the number of planes can be extended to very large numbers. As shown in FIG. 1, the memory array is formed on an integrated circuit substrate having an insulating layer 10 over underlying semiconductor or other structures (not shown). The memory array includes a plurality of stacks of semiconductor material strips 11, 12, 13, 14 separated by insulating material 21, 22, 23, 24. The stacks are ridge-shaped extending on the Y-axis as illustrated in the figure, so that the semiconductor material strips 11-14 can be configured as strings. Semiconductor material strips 11 and 13 can act as strings in a first memory plane. Semiconductor material strips 12 and 14 can act as strings in a second memory plane. A layer 15 of memory material, such as an anti-fuse material, coats the plurality of stacks of semiconductor material strips in this example, and at least on the side walls of the semiconductor material strips in other examples. A plurality of conductive lines 16, 17 is arranged orthogonally over the plurality of stacks of semiconductor material strips. The conductive lines 16, 17 have surfaces conformal with the plurality of stacks of semiconductor material strips, filling the trenches (e.g. 20) defined by the plurality of stacks, and defining a multi-layer array of interface regions at cross-points between side surfaces of the semiconductor material strips 11-14 on the stacks and conductive lines 16, 17. A layer of silicide (e.g. tungsten silicide, cobalt silicide, titanium silicide) 18, 19 can be formed over the top surfaces of the conductive lines 16, 17.

The layer 15 of memory material can consist of an anti-fuse material such as a silicon dioxide, silicon oxynitride or other silicon oxide, for example having a thickness on the order of 1 to 5 nanometers. Other anti-fuse materials may be used, such as silicon nitride. The semiconductor material strips 11-14 can be a semiconductor material with a first conductivity type (e.g. p-type). The conductive lines 16, 17 can be a semiconductor material with a second conductivity type (e.g. n-type). For example, the semiconductor material strips 11-14 can be made using p-type polysilicon while the conductive lines 16, 17 can be made using relatively heavily doped n+-type polysilicon. The width of the semiconductor material strips should be enough to provide room for a depletion region to support the diode operation. As result, memory cells comprising a rectifier formed by the p-n junction with a programmable anti-fuse layer in between the anode and cathode are formed in the 3D array of cross-points between the polysilicon strips and lines. In other embodiments, different programmable resistance memory materials can be used, including transition metal oxides like tungsten oxide on tungsten or doped metal oxide conductive strips. Such materials can be programmed and erased, and can be implemented for operations storing multiple bits per cell.

FIG. 2 shows a cross-section view cut in the X-Z plane of the memory cell formed at the intersection of conductive line 16 and semiconductor material strip 14. Active regions 25, 26 are formed on the both sides of the strip 14 between the conductive line 16 and the semiconductor material strip 14. In the native state, a layer 15 of anti-fuse material has a high resistance. After programming, the anti-fuse material breaks down, causing one or both of the active areas 25, 26 within the anti-fuse material to assume a low resistance state. In the embodiment described here, each memory cell has two active regions 25, 26, one on each side of the semiconductor material strip 14. FIG. 3 shows a cross-section view in the X-Y plane of the memory cell formed at the intersection of the conductive lines 16, 17 and the semiconductor material strip 14. The current path from the word line defined by the conductive line 16 through the layer 15 of anti-fuse material and down the semiconductor material strip 14 is illustrated.

Electron current as illustrated by the dashed arrows in FIG. 3, flows from the n+ conductive lines 16 into the p-type semiconductor material strips, and along the semiconductor material strip ( - - - arrow) to sense amplifiers where it can be measured to indicate the state of a selected memory cell. In a typical embodiment, using a layer of silicon oxide about one nanometer thick as the anti-fuse material, a programming pulse may comprise a 5 to 7 volt pulse having a pulse width of about one microsecond, applied under control of on-chip control circuits as described below with reference to FIG. 17. A read pulse may comprise a 1 to 2 volt pulse having a pulse width that depends on the configuration, applied under control of on-chip control circuits as described below with reference to FIG. 17. The read pulse can be much shorter than the programming pulse.

FIG. 4 is a schematic diagram showing 2 planes of memory cells having 6 cells each. The memory cells are represented by diode symbols with a dashed line representing the layer of anti-fuse material between the anode and the cathode. The 2 planes of memory cells are defined at the cross-points of conductive lines 60, 61 acting as a first word line WLn and a second word line WLn+1 with a first stack of semiconductor material strips 51, 52, a second stack of semiconductor material strips 53, 54 and a third stack of semiconductor material strips 55, 56 acting as strings BLn, BLn+1 and BLn+2 in first and second layers of the array. The first plane of memory cells includes memory cells 30, 31 on semiconductor material strip 52, memory cells 32, 33 on semiconductor material strip 54, and memory cells 34, 35 on semiconductor material strip 56. The second plane of memory cells includes memory cells 40, 41 on semiconductor material strip 51, memory cells 42, 43 on semiconductor material strip 53, and memory cells 44, 45 on semiconductor material strip 55. As shown in the figure, the conductive line 60, acting as word line WLn, includes vertical extensions 60-1, 60-2, 60-3 which correspond with the material in the trench 20 shown in FIG. 1 between the stacks in order to couple the conductive line 60 to the memory cells along the 3 illustrated semiconductor material strips in each plane. An array having many layers can be implemented as described herein, enabling very high density memory approaching or reaching terabits per chip.

FIG. 5 is a perspective drawing of a 2×2 portion of a three-dimensional charge trapping memory array with fill material removed from the drawing to give a view of the stacks of semiconductor material strips and orthogonal conductive lines that make up the 3D array. In this illustration, only 2 layers are shown. However, the number of layers can be extended to very large numbers. As shown in FIG. 5, the memory array is formed on an integrated circuit substrate having an insulating layer 110 over underlying semiconductor or other structures (not shown). The memory array includes a plurality of stacks (2 are shown in the drawing) of semiconductor material strips 111, 112, 113, 114 separated by insulating material 121, 122, 123, 124. The stacks are ridge-shaped extending on Y-axis as illustrated in the figure, so that the semiconductor material strips 111-114 can be configured as strings. Semiconductor material strips 111 and 113 can act as strings in a first memory plane. Semiconductor material strips 112 and 114 can act as strings in a second memory plane.

The insulating material 121 between the semiconductor material strips 111 and 112 in a first stack and the insulating material 123 between semiconductor material strips 113 and 114 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 115 of memory material, such as a dielectric charge trapping structure, coats the plurality of stacks of semiconductor material strips in this example. A plurality of conductive lines 116, 117 is arranged orthogonally over the plurality of stacks of semiconductor material strips. The conductive lines 116, 117 have surfaces conformal with the plurality of stacks of semiconductor material strips, filling the trenches (e.g. 120) defined by the plurality of stacks, and defining a multi-layer array of interface regions at cross-points between side surfaces of the semiconductor material strips 111-114 on the stacks and conductive lines 116, 117. A layer of silicide (e.g. tungsten silicide, cobalt silicide, titanium silicide) 118, 119 can be formed over the top surfaces of the conductive lines 116, 117.

Nanowire MOSFET type cells can also be configured in this manner, by providing nanowire or nanotube structures in channel regions on conductive lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

As a result, a 3D array of SONOS-type memory cells configured in a NAND flash array can formed. The source, drain and channel are formed in the silicon (S) semiconductor material strips 111-114, the layer 115 of the memory material includes a tunneling dielectric layer 97 which can be formed of silicon oxide (O), a charge storage layer 98 which can be formed of silicon nitride (N), a blocking dielectric layer 99 which can be formed of silicon oxide (O), and the gate comprises polysilicon (S) of the conductive lines 116, 117.

The semiconductor material strips 111-114 can be a p-type semiconductor material. The conductive lines 116, 117 can be a semiconductor material with the same or a different conductivity type (e.g. p+-type). For example, the semiconductor material strips 111-114 can be made using p-type polysilicon, or p-type epitaxial single crystal silicon, while the conductive lines 116, 117 can be made using relatively heavily doped p+-type polysilicon.

Alternatively, the semiconductor material strips 111-114 can be n-type semiconductor material. The conductive lines 116, 117 can be a semiconductor material with the same or a different conductivity type (e.g. p+-type). This n-type strip arrangement results in buried-channel, depletion mode charge trapping memory cells. For example, the semiconductor material strips 111-114 can be made using n-type polysilicon, or n-type epitaxial single crystal silicon, while the conductive lines 116, 117 can be made using relatively heavily doped p+-type polysilicon. A typical doping concentration for n-type semiconductor material strips can be around $10^{18}/cm^3$, with usable embodiments likely in the range of $10^{17}/cm^3$ to $10^{19}/cm^3$. The use of n-type semiconductor material strips can be particularly beneficial in junction-free embodiments to improve conductivity along the NAND strings and thereby allowing higher read current.

Thus, memory cells comprising field effect transistors having charge storage structures are formed in the 3D array of cross-points. Using dimensions for the widths of the semiconductor material strips and conductive lines on the order of 25 nanometers, with gaps between the ridge-shaped stacks on the order of 25 nanometers, a device having a few tens of layers (e.g. 30 layers) can approach terabit capacity ($10^{12}$) in a single chip.

The layer 115 of memory material can comprise other charge storage structures. For example, a bandgap engineered SONOS (BE-SONOS) charge storage structure can be used which includes a dielectric tunneling layer 97 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 115 in this embodiment comprises silicon dioxide on the side surface of the semiconductor material strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 115 of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material is the p+ polysilicon (work function about 5.1 eV) used in the conductive lines 116, 117.

FIG. 6 shows a cross-section view cut in the X-Z plane of the charge trapping memory cell formed at the intersection of conductive line 116 and semiconductor material strip 114. Active charge trapping regions 125, 126 are formed on the both sides of the strip 114 between the conductive lines 116 and the strip 114. In the embodiment described here, as shown in FIG. 6, each memory cell is a double gate field effect transistor having active charge storage regions 125, 126, one on each side of the semiconductor material strip 114.

FIG. 7 shows a cross-section view cut in the X-Y plane of the charge trapping memory cell formed at the intersection of the conductive lines and 116, 117 and the semiconductor material strip 114. The current path down the semiconductor material strip 114 is illustrated. Electron current as illustrated by the dashed arrows in the diagram flows along the p-type semiconductor material strips, to sense amplifiers where it can be measured to indicate the state of a selected memory cell. The source/drain regions 128, 129, 130 between the conductive lines 116, 117 which act as word lines can be "junction-free", without source and drain doping having a conductivity type opposite that of the channel regions beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor material strips 111-114 can be implemented using a lightly doped n-type semiconductor body in junction free arrangements, resulting in a buried-channel field effect transistor which can operate in depletion mode, with naturally shifted lower threshold distributions for the charge trapping cells.

Figure 8:
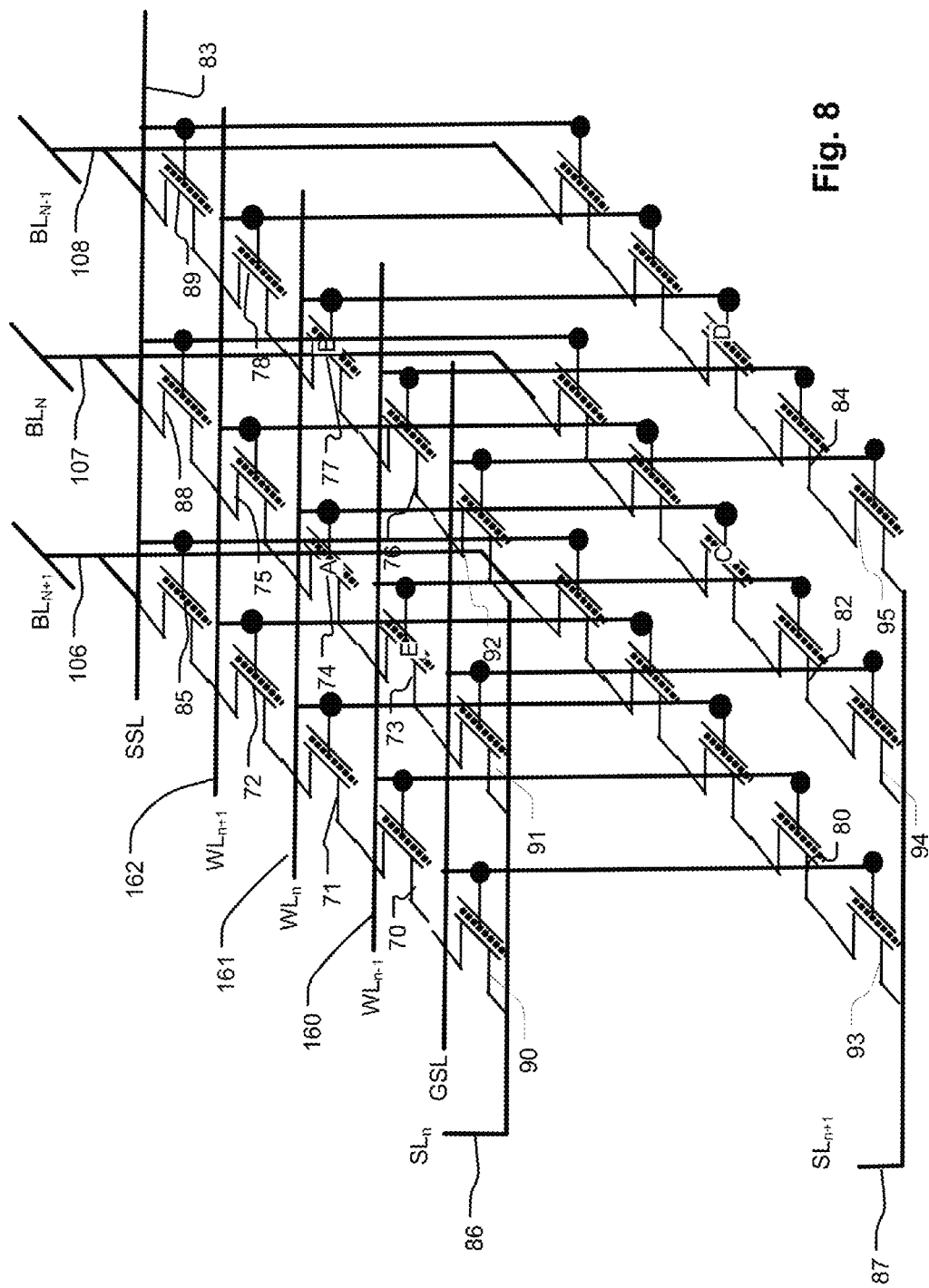
FIG. 8 is a schematic diagram of NAND flash memory having the structure of FIG. 5 and FIG. 23.

FIG. 8 is a schematic diagram showing 2 planes of memory cells having 9 charge trapping cells arranged in a NAND configuration, which is representative of a cube which can include many planes and many word lines. The 2 planes of memory cells are defined at the cross-points of conductive lines 160, 161, 162 acting as a word line WLn−1, word line WLn, and word line WLn+1, with a first stack of semiconductor material strips, a second stack of semiconductor material strips and a third stack of semiconductor material strips.

The first plane of memory cells includes memory cells 70, 71, 72 in a NAND string on a semiconductor material strip, memory cells 73, 74, 75 in a NAND string on a semiconductor material strip, and memory cells 76, 77, 78 in a NAND string on a semiconductor material strip. The second plane of memory cells corresponds with a bottom plane in the cube in this example, and includes memory cells (e.g. 80, 82, 84) arranged in NAND strings in a similar manner those in the first plane.

As shown in the figure, the conductive line 161 acting as word line WLn includes vertical extensions which correspond with the material in the trench 120 shown in FIG. 5 between the stacks, in order to couple the conductive line 161 to the memory cells (cells 71, 74, 77 in the first plane) in the interface regions in the trenches between the semiconductor material strips in all of the planes.

The bit lines and source lines are at opposite ends of the memory strings. Bit lines 106, 107 and 108, are connected to different stacks of memory strings and are controlled by bit line signals $BL_{n-1}$, $BL_n$ and $BL_{n+1}$. Source line 86 controlled by signal $SSL_n$ terminates NAND strings in the upper plane in this arrangement. Likewise, source line 87 controlled by signal $SSL_{n+1}$ terminates NAND strings in the lower plane in this arrangement.

String select transistors 85, 88, and 89 are connected between the NAND strings and a respective one of the bit lines $BL_{N+1}$, $BL_N$, $BL_{N+1}$ in this arrangement. String select lines 83 is parallel to the word lines.

Block select transistors 90-95 couple the NAND strings to one of the source lines. The ground select signal GSL in this example is coupled to the gates of the block select transistors 90-95, and can be implemented in the same manner as the conductive lines 160, 161 and 162. The string select transistors and block select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Figure 9:
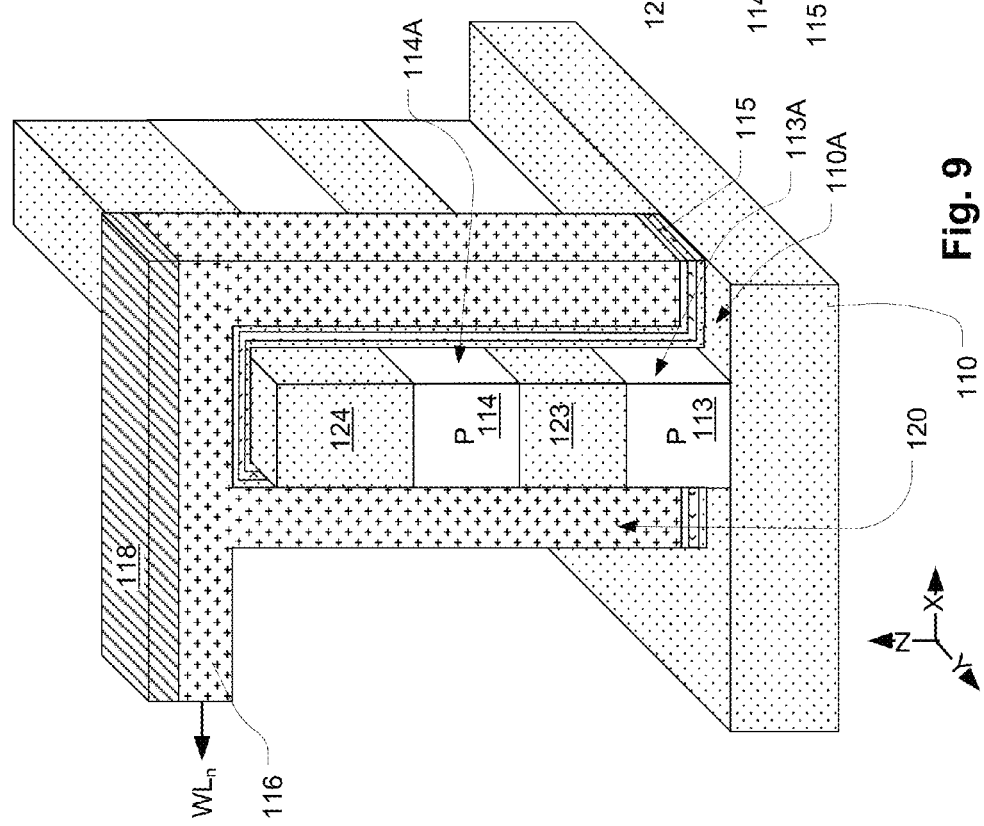
FIG. 9 is a perspective illustration of an alternative implementation of a 3D NAND-flash memory structure like that of FIG. 5, where the memory layer is removed between the conductive lines.

FIG. 9 is a perspective drawing of an alternative structure like that of FIG. 5. The reference numerals of similar structures are reused in the figure, and not described again. FIG. 9 differs from FIG. 5 in that the surface 110A of the insulating layer 110, and the side surfaces 113A, 114A of the semiconductor material strips 113, 114 are exposed between the conductive lines 116 which act as word lines, as a result of the etch process which forms the word lines. Thus, the layer 115 of memory material can be completely or partially etched between the word lines without harming operation. However, there is no necessity in some structures for etching through the memory layer 115 forming the dielectric charge trapping structures like those described here.

Figure 10:
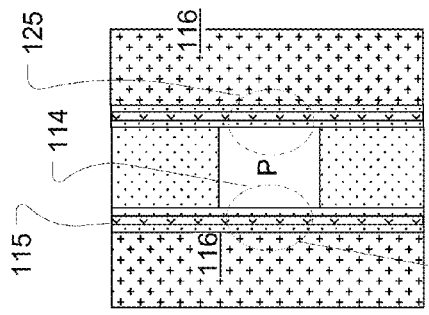
FIG. 10 is a cross-section of a memory cell taken in the X-Z plane from the structure of FIG. 9.
Figure 11:
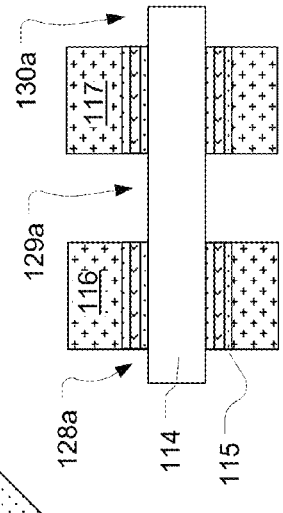
FIG. 11 is a cross-section of a memory cell taken in the X-Y plane from the structure of FIG. 9.

FIG. 10 is a cross-section of a memory cell in the X-Z plane like that of FIG. 6. FIG. 10 is identical to FIG. 6, illustrating that a structure like that of FIG. 9 results in memory cells that are the same as those implemented in the structure of FIG. 5 in this cross-section. FIG. 11 is a cross-section section of a memory cell in the X-Y plane like that of FIG. 7. FIG. 11 differs from FIG. 7 in that the regions 128a, 129a and 130a along the side surfaces (e.g. 114A) of the semiconductor material strip 114 may have the memory material removed.

Figure 12:
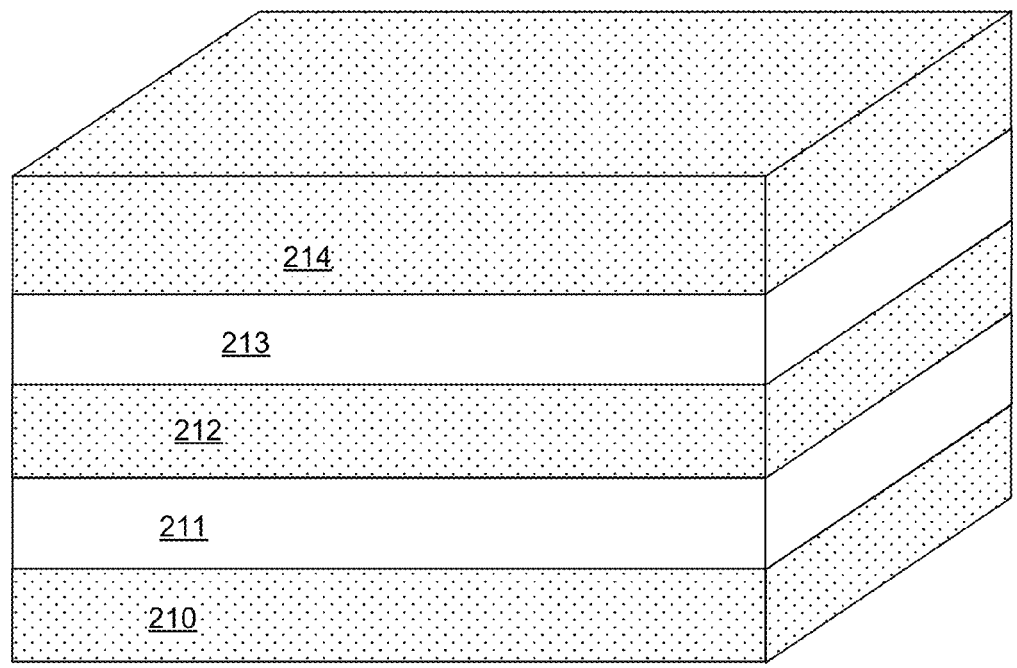
FIG. 12 illustrates a first stage in a process for manufacturing a memory device like that of FIGS. 1, 5 and 9.

FIGS. 12-16 illustrate stages in a basic process flow for implementing 3D memory arrays as described above utilizing only 2 pattern masking steps that are critical alignment steps for array formation. In FIG. 12, a structure is shown which results from alternating deposition of insulating layers 210, 212, 214 and conductor layers 211, 213 formed using doped semiconductors for example in a blanket deposition in the array area of a chip. Depending on the implementation, the conductor layers 211, 213 can be implemented using polysilicon or epitaxial single crystal silicon having n-type or p-type doping. Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art.

Figure 13:
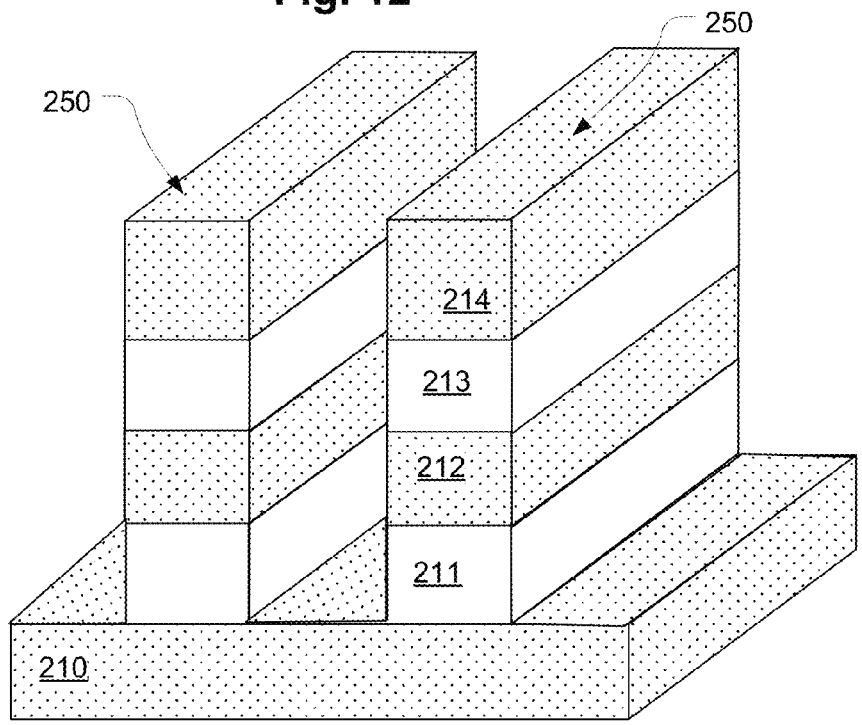
FIG. 13 illustrates a second stage in a process for manufacturing a memory device like that of FIGS. 1, 5 and 9.

FIG. 13 shows the result of a first lithographic patterning step used to define a plurality of ridge-shaped stacks 250 of semiconductor material strips, where the semiconductor material strips are implemented using the material of the conductor layers 211, 213, and separated by the insulating layers 212, 214. Deep, high aspect ratio trenches can be formed in the stack, supporting many layers, using lithography based processes applying a carbon hard mask and reactive ion etching.

Figure 14A:
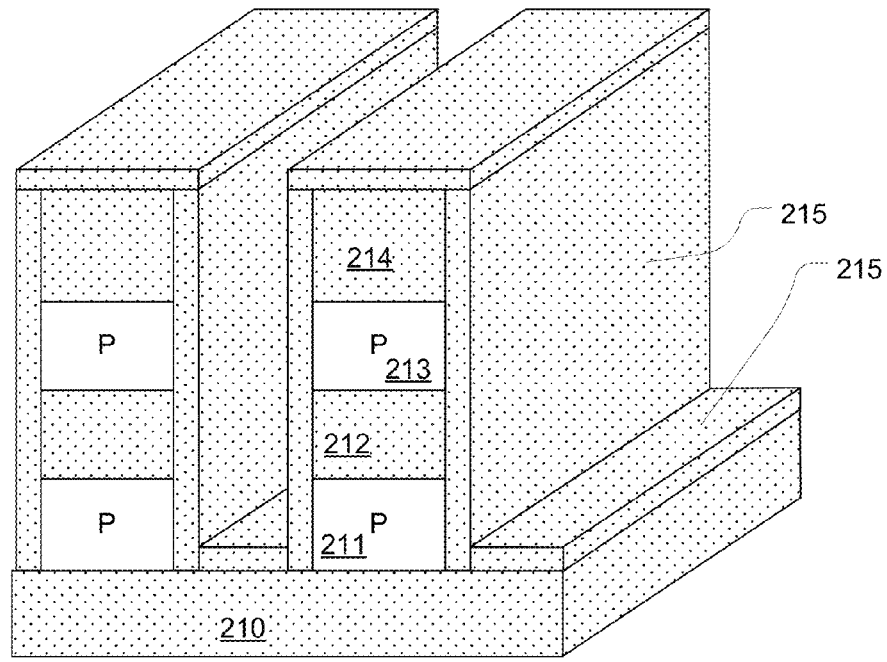
FIG. 14A illustrates a third stage in a process for manufacturing a memory device like that of FIG. 1.
Figure 14B:
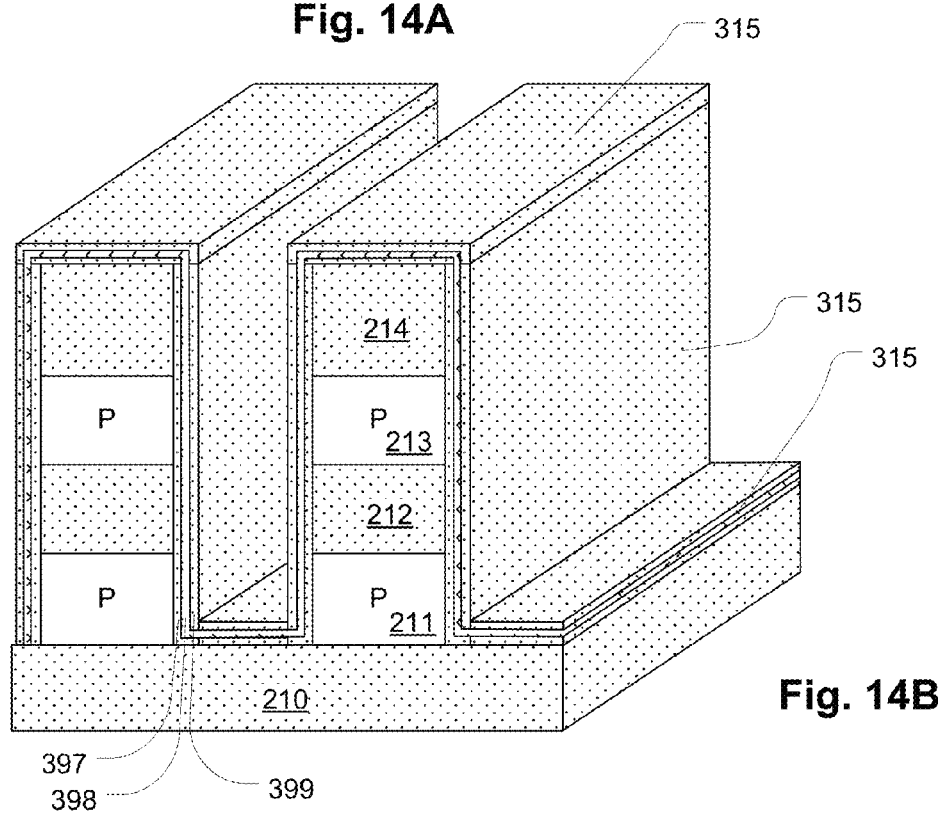
FIG. 14B illustrates a third stage in a process for manufacturing a memory device like that of FIG. 5.

FIGS. 14A and 14B show the next stage for, respectively, an embodiment including a programmable resistance memory structure such as an anti-fuse cell structure, and an embodiment including a programmable charge trapping memory structure such as a SONOS type memory cell structure.

FIG. 14A shows results of a blanket deposition of a layer 215 of memory material in an embodiment in which the memory material consists of a single layer as in the case of an anti-fuse structure like that shown in FIG. 1. In an alternative, rather than a blanket deposition, an oxidation process can be applied to form oxides on the exposed sides of the semiconductor material strips, where the oxides act as the memory material.

FIG. 14B shows results of blanket deposition of a layer 315 that comprises multilayer charge trapping structure including a tunneling layer 397, a charge trapping layer 398 and a blocking layer 399 as described above in connection with FIG. 4. As shown in FIGS. 14A and 14B, the memory layers 215, 315 are deposited in a conformal manner over the ridge-shaped stacks (250 of FIG. 13) of semiconductor material strips.

Figure 15:
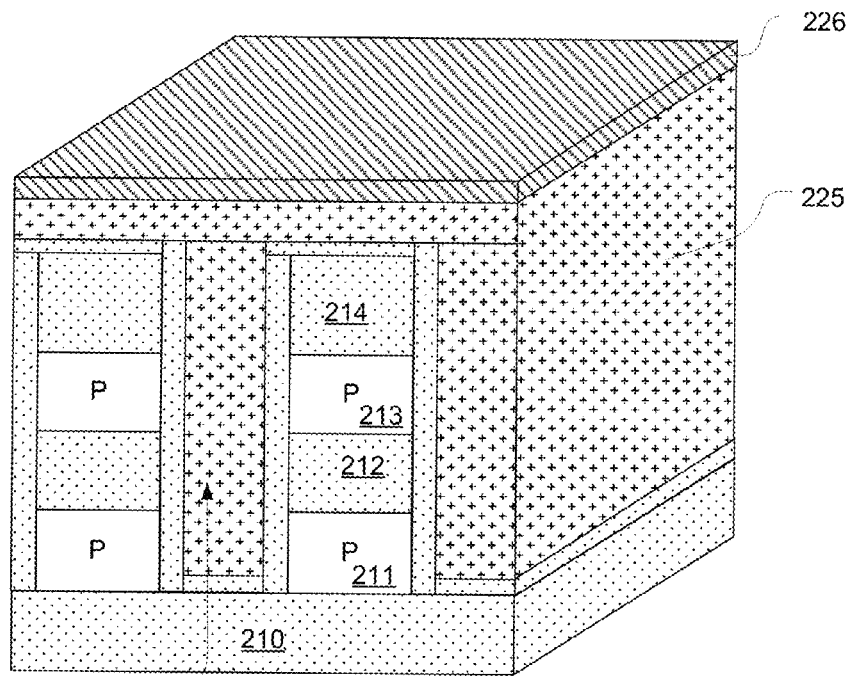
FIG. 15 illustrates a third stage in a process for manufacturing a memory device like that of FIGS. 1, 5 and 9.

FIG. 15 shows the results of a high aspect ratio fill step in which conductive material, such as polysilicon having n-type or p-type doping, to be used for the conductive lines which act as word lines, is deposited to form layer 225. Also, a layer of silicide 226 can be formed over the layer 225 in embodiments in which polysilicon is utilized. As illustrated in the figure, high aspect ratio deposition technologies such as low-pressure chemical vapor deposition of polysilicon in the illustrated embodiments is utilized to completely fill the trenches 220 between the ridge-shaped stacks, even very narrow trenches on the order of 10 nanometers wide with high aspect ratio.

Figure 16:
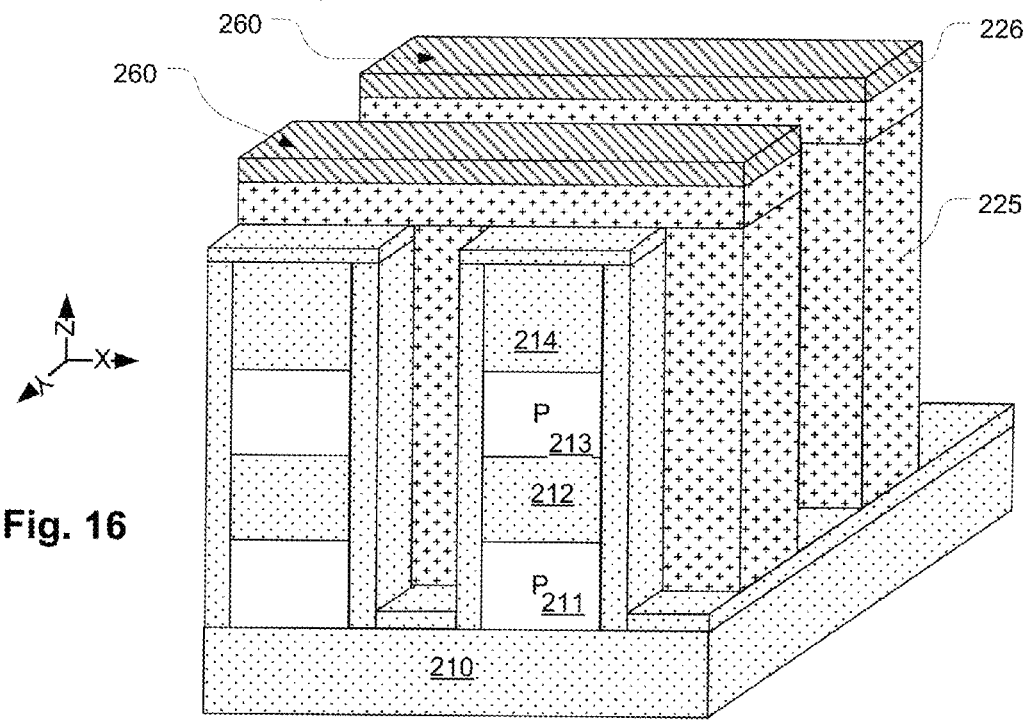
FIG. 16 illustrates a fourth stage in a process for manufacturing a memory device like that of FIGS. 1, 5 and 9.

FIG. 16 shows results of the second lithographic patterning step used to define a plurality of conductive lines 260 which act as word lines for the 3D memory array. The second lithographic patterning step utilizes a single mask for critical dimensions of the array for etching high aspect ratio trenches between the conductive lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on the underlying insulating layer 210.

An optional manufacturing step includes forming hard masks over the plurality of conductive lines, including word lines, ground select lines, and string select lines. The hard masks can be formed using a relatively thick layer of silicon nitride or other material which can block ion implantation processes. After the hard masks are formed, an implant can be applied to increase the doping concentration in the semiconductor material strips, and thereby reduce the resistance of the current path along the semiconductor material strips. By utilizing controlled implant energies, the implants can be caused to penetrate to the bottom semiconductor material strip, and each overlying semiconductor material strip in the stacks.

The hard masks are removed, exposing the silicide layers along the top surfaces of the conductive lines. After an inter-layer dielectric is formed over the top of the array, vias are opened in which contact plugs using tungsten fill for example, are formed. Overlying metal lines are patterned to connect as BL lines, to decoder circuits. A three-plane decoding network is established in the illustrated manner, accessing a selected cell using one word line, one bit line and one source line. See, U.S. Pat. No. 6,906,940, entitled Plane Decoding Method and Device for Three Dimensional Memories.

To program a selected anti-fuse type cell, in this embodiment the selected word line can be biased with −7 Volts, the unselected word lines can be set at 0 Volts, the selected bit line can be set at 0 Volts, the unselected bit lines can be set at 0 Volts, the selected SL line can be set at −3.3 volts, and the unselected SL lines can be set at 0 Volts. To read a selected cell, in this embodiment the selected word line can be biased with −1.5 Volts, the unselected word lines can be set at 0 Volts, the selected bit line can be set at 0 Volts, the unselected bit lines can be set at 0 Volts, the selected SL line can be set at −3.3 volts, and the unselected SL lines can be set at 0 Volts.

Figure 17:
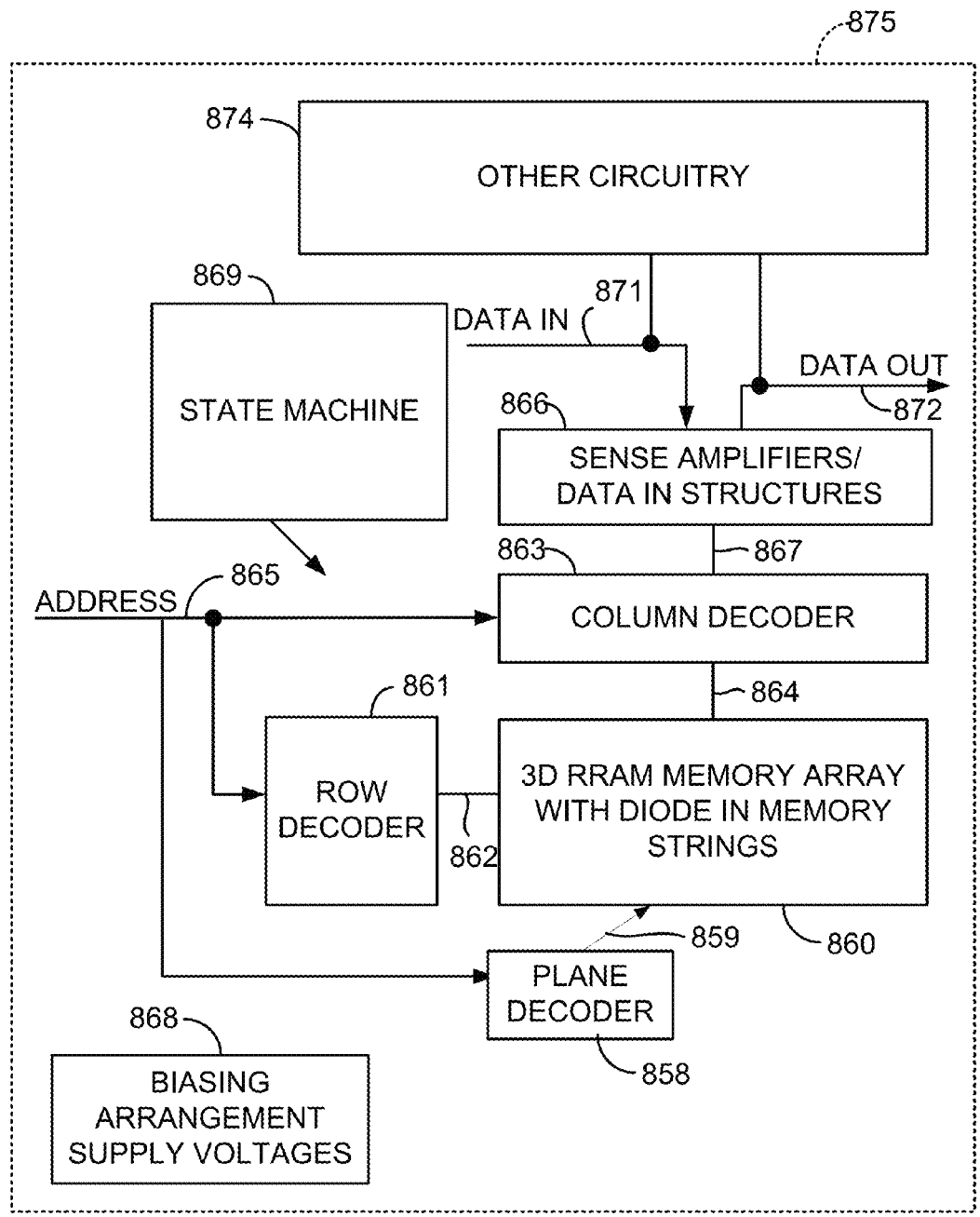
FIG. 17 is a schematic diagram of an integrated circuit including a 3D programmable resistance memory array with row, column and plane decoding circuitry.

FIG. 17 is a simplified block diagram of an integrated circuit according to an embodiment of the present invention. The integrated circuit line 875 includes a 3D programmable resistance memory array 860 (RRAM) implemented as described herein, on a semiconductor substrate. A row decoder 861 is coupled to a plurality of word lines 862, and arranged along rows in the memory array 860. A column decoder 863 is coupled to a plurality of bit lines 864 (or SSL lines as described above) arranged along columns in the memory array 860 for reading and programming data from the memory cells in the array 860. A plane decoder 858 is coupled to a plurality of planes in the memory array 860 on SSL lines 859 (or bit lines as described above). Addresses are supplied on bus 865 to column decoder 863, row decoder 861 and plane decoder 858. Sense amplifiers and data-in structures in block 866 are coupled to the column decoder 863 in this example via data bus 867. Data is supplied via the data-in line 871 from input/output ports on the integrated circuit 875 or from other data sources internal or external to the integrated circuit 875, to the data-in structures in block 866. In the illustrated embodiment, other circuitry 874 is included on the integrated circuit, such as a general purpose processor or special purpose application circuitry, or a combination of modules providing system-on-a-chip functionality supported by the programmable resistance cell array. Data is supplied via the data-out line 872 from the sense amplifiers in block 866 to input/output ports on the integrated circuit 875, or to other data destinations internal or external to the integrated circuit 875.

A controller implemented in this example using bias arrangement state machine 869 controls the application of bias arrangement supply voltage generated or provided through the voltage supply or supplies in block 868, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 18:
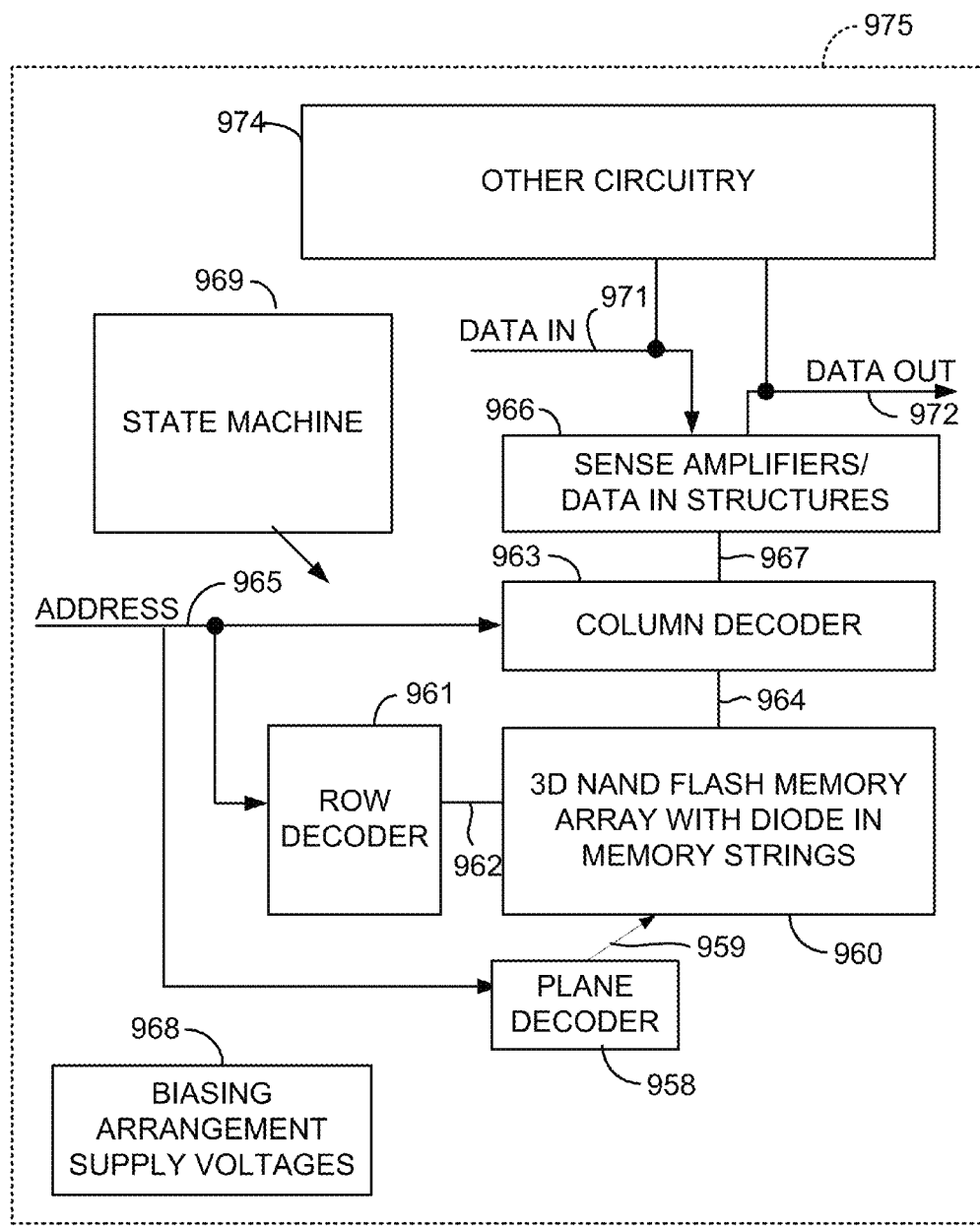
FIG. 18 is a schematic diagram of an integrated circuit including a 3D NAND-flash memory array with row, column and plane decoding circuitry.

FIG. 18 is a simplified block diagram of an integrated circuit according to an embodiment of the present invention. The integrated circuit line 975 includes a 3D NAND flash memory array 960, implemented as described herein including diodes in the local bit line paths for the memory strings, on a semiconductor substrate. A row decoder 961 is coupled to a plurality of word lines 962, and arranged along rows in the memory array 960. A column decoder 963 is coupled to a plurality of bit lines 964 (or SSL lines as described above)

arranged along columns in the memory array 960 for reading and programming data from the memory cells in the array 960. A plane decoder 958 is coupled to a plurality of planes in the memory array 960 via SSL lines 959 (or bit lines as described above). Addresses are supplied on bus 965 to column decoder 963 including a page buffer, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 19:
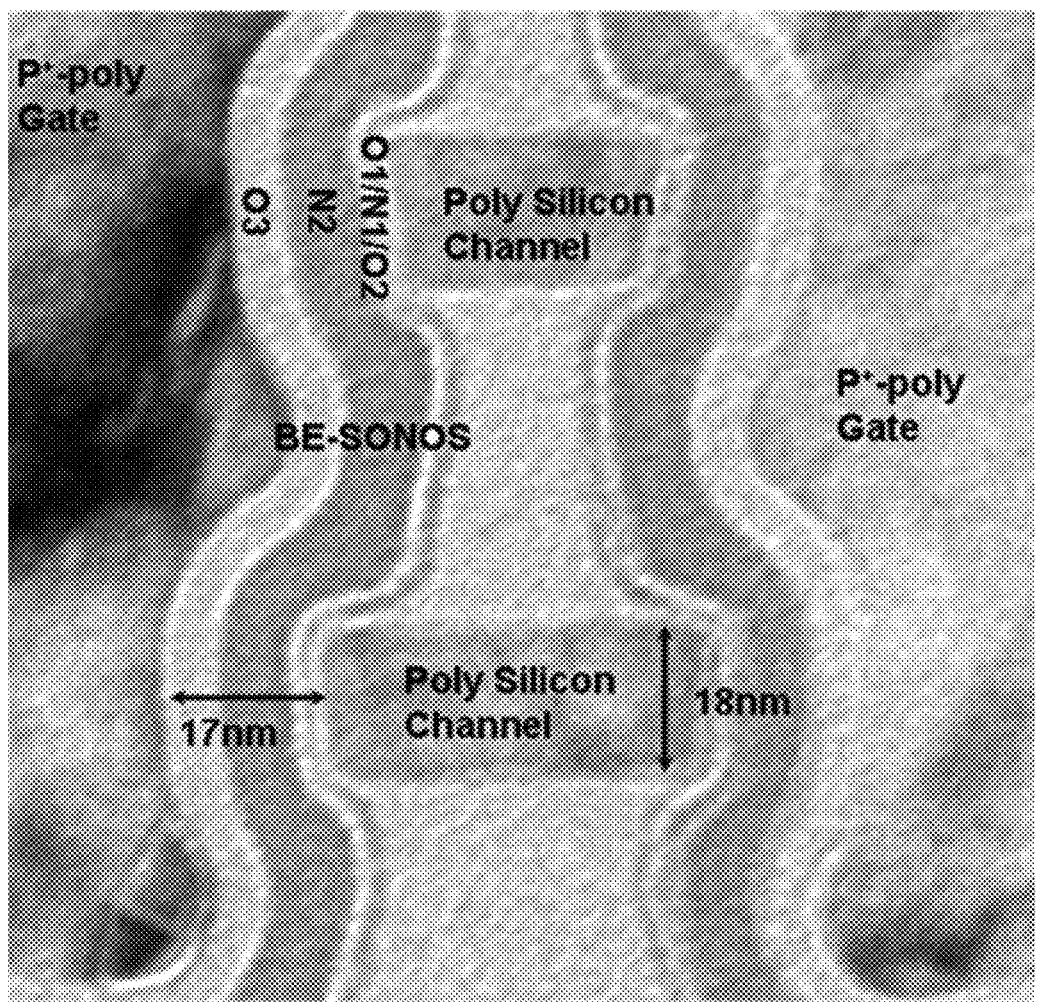
FIG. 19 is a transmission electron microscope TEM image of a portion of 3D NAND-flash memory array.
Figure 23:
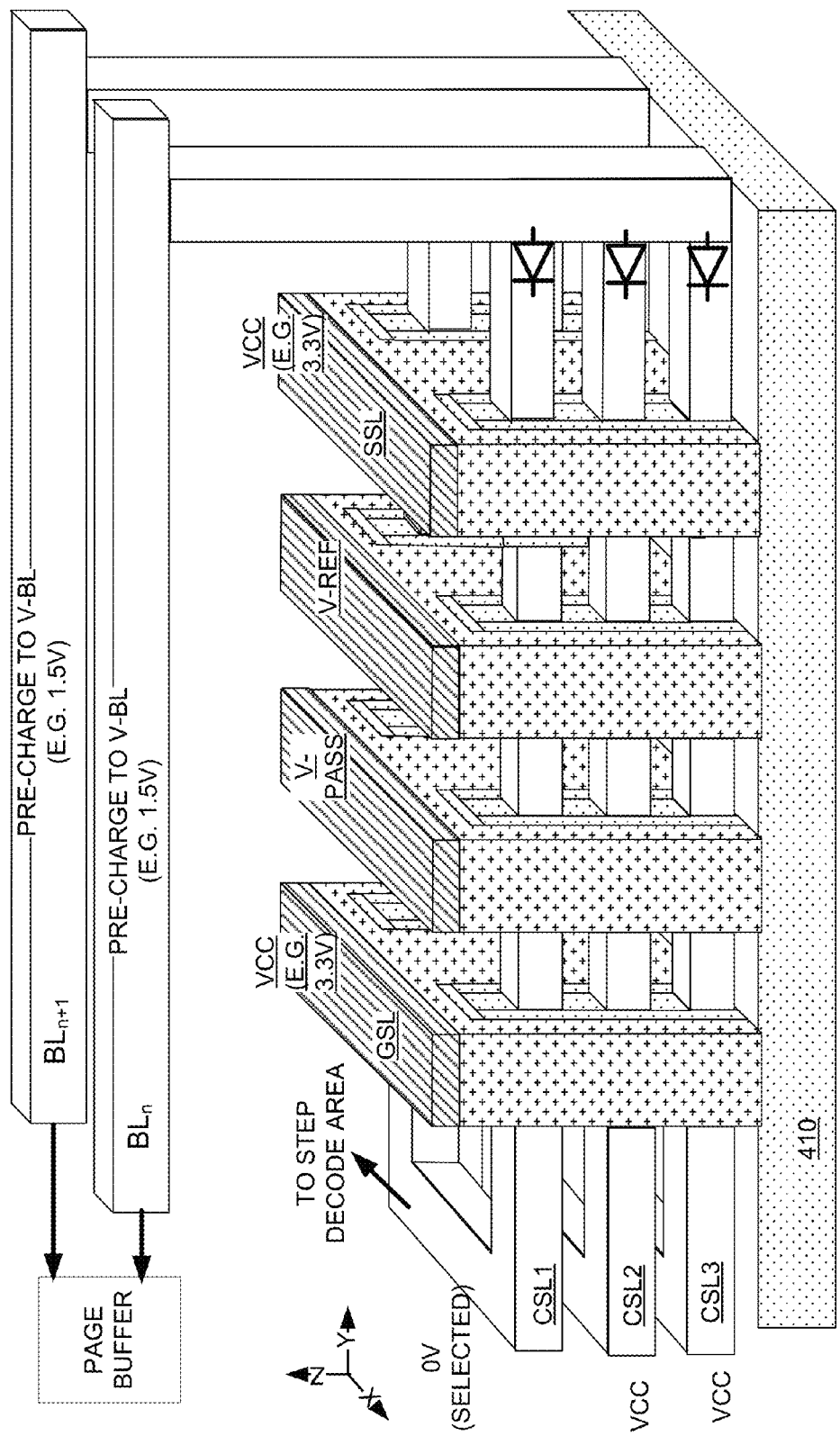
FIG. 23 is a perspective view of a 3D NAND-flash memory structure including diodes in the strings between the bit line structures and the memory strings, undergoing a read operation.

FIG. 19 is a TEM cross-section of a portion of an 8-layer vertical gate, thin-film-transistor, BE-SONOS charge trapping NAND device which has been fabricated and tested, arranged for decoding as shown in FIGS. 8 and 23. The device was made with a 75 nm half pitch. The channels were n-type polysilicon about 18 nm thick. No additional junction implant was used, resulting in a junction free structure. The insulating material between the strips to isolate the channels in the Z-direction was silicon dioxide was about 40 nm thick. The gates were provided by a p+-polysilicon line. The SSL and GSL devices had longer channel lengths than the memory cells. The test device implemented 32 word line, junction-free NAND strings. The width of the lower strip in FIG. 19 is greater than the width of the upper strip because the trench etch used to form the structure resulted in a tapered side wall with progressively wider strips as the trench becomes deeper, and with the insulating material between the strips being etched more than the polysilicon.

Figure 20:
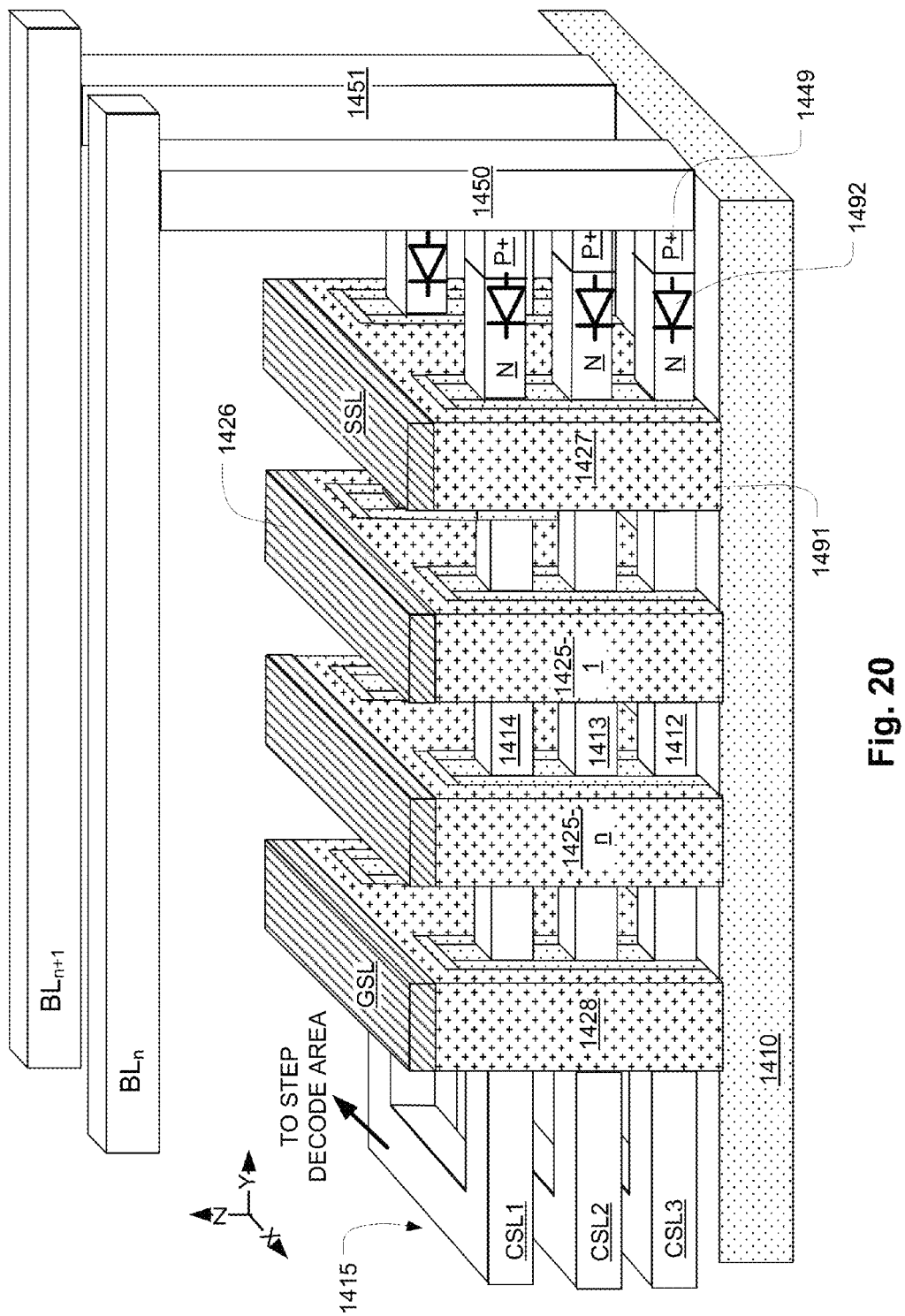
FIG. 20 is a perspective view of a 3D NAND-flash memory structure including diodes in the strings between the bit line structures and the memory strings.

FIG. 20 illustrates a perspective of embodiment including diodes (e.g. diode 1492) in the semiconductor bodies of the NAND strings. The structure includes a plurality of ridge shaped stacks including the semiconductor material strips 1414, 1413, 1412 in respective planes of the ridge shaped stacks on a substrate 1410. A plurality of conductive lines 1425-1 to 1425-$n$ (only two are shown for simplicity in this diagram) act as word lines which extend orthogonally across the stacks, and are conformal over memory layers as described above. Conductive line 1427 acts as a string select lines (SSL) and conductive line 1428 acts as a common source select line (GSL) and such lines are arranged parallel to the plurality of conductive lines acting as word lines. These conductive lines are formed by conductive material 1491, such as polysilicon having n-type or p-type doping, to be used for the conductive lines which act as word lines. Silicide layers 1426 can overlie the tops of the conductive lines acting as word lines, string select lines and common source select lines.

In the region 1415, the semiconductor material strips 1414, 1413, 1412 are connected to the other semiconductor material strips in the same planes by common source line interconnections, and to a plane decoder (not shown). The semiconductor material strips are extended in the common source line interconnections using a stepped contacting area as described above.

Diodes (e.g. 1492) are placed between the memory cells coupled to the word lines 1425-1 through 1425-$n$ and plugs 1450, 1451 which couple the semiconductor material strips 1414, 1413, 1412 to bit lines BLn, BLn+1. In the illustrated example, the diodes are formed by a P+ implant region (e.g. 1449) in the semiconductor material strips. Plugs 1450, 1451 can comprise doped polysilicon, tungsten or other vertical interconnect technologies. Overlying bit lines BLn, BLn+1 are connected between the plugs 1450, 1451 and column decoding circuitry (not shown). SLs source lines of each layer are separately decoded. SSL string select line/GSL ground select line, WL's word lines, and BL's bit lines are common vertically for the multilayer stacks.

In the structure shown in FIG. 20, no contacts need to be formed in the array to be string select gates and common source select gates.

Figure 21:
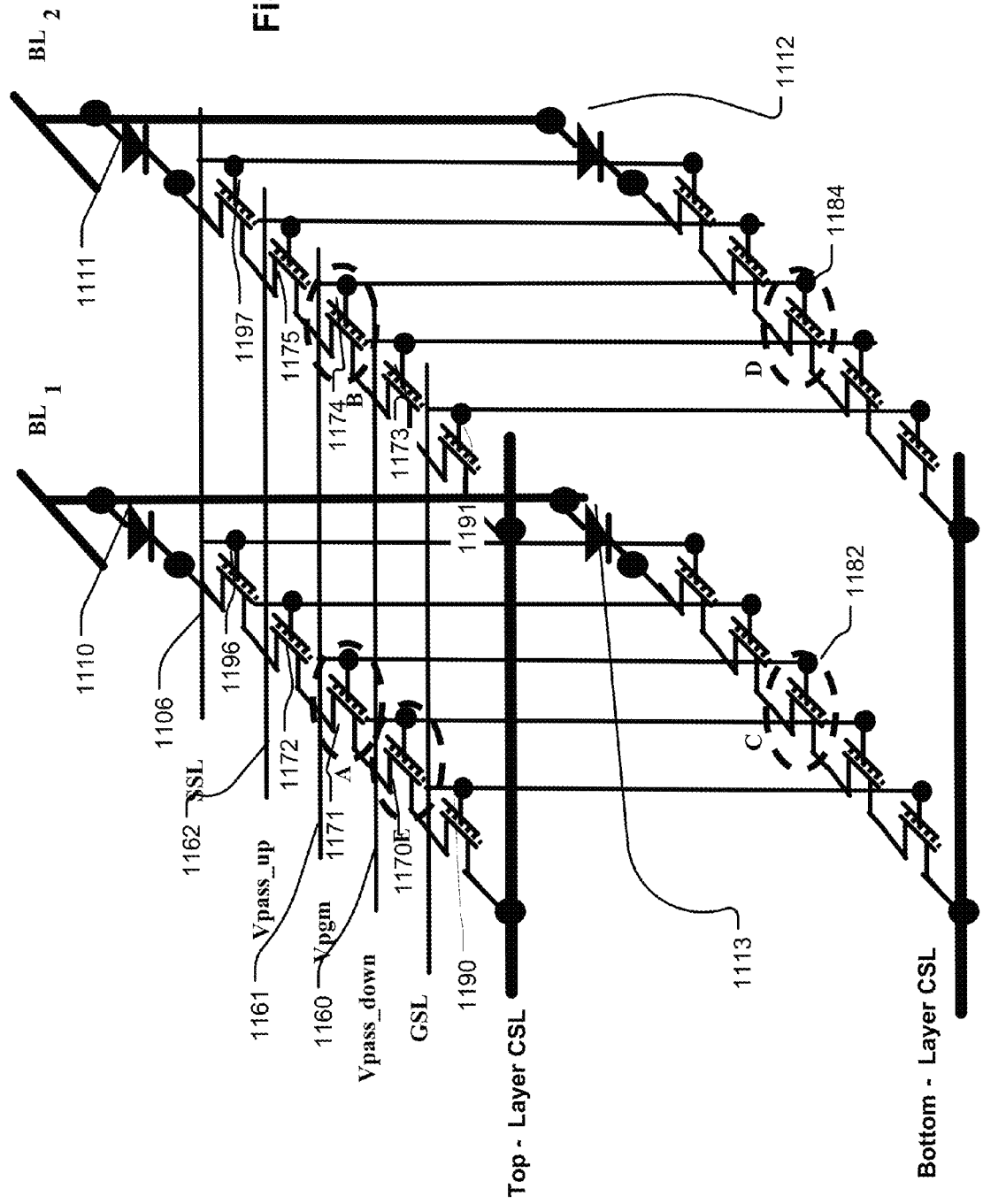
FIG. 21 is a perspective schematic diagram of a 3D NAND-flash memory structure including diodes in the strings between the bit line structures and the memory strings, showing 2 planes of memory cells having 6 charge trapping cells arranged in a NAND configuration.

FIG. 21 is a schematic diagram showing 2 planes of memory cells having 6 charge trapping cells arranged in a NAND configuration, which is representative of a cube which can include many planes and many word lines. The 2 planes of memory cells are defined at the cross-points of conductive lines 1160, 1161, 1162 acting as a word line WLn−1, word line WLn, and word line WLn+1, with a first stack of semiconductor material strips, a second stack of semiconductor material strips and a third stack of semiconductor material strips.

The first plane of memory cells includes memory cells 1170, 1171, 1172 in a NAND string on a semiconductor material strip, and memory cells 1173, 1174, 1175 in a NAND string on a semiconductor material strip. The second plane of memory cells corresponds with a bottom plane in the cube in this example, and includes memory cells (e.g. 1182, 1184) arranged in NAND strings in a manner similar to those in the first plane.

As shown in the figure, the conductive line 1161 acting as word line WLn includes vertical extensions which correspond with the material in the trench 120 shown in FIG. 5 between the stacks, in order to couple the conductive line 1161 to the memory cells (cells 1171, 1174 in the first plane) in the interface regions in the trenches between the semiconductor material strips in all of the planes.

String select transistors 1196, 1197 are connected between respective NAND strings and corresponding bit lines BL1 and BL2 in this arrangement. Likewise, similar string select transistors on a bottom plane in the cube are connected between respective NAND strings and corresponding bit lines BL1 and BL2 in this arrangement, so that column decoding is applied to the bit lines. String select line 1106 is connected to the string select transistors 96, 97, and arranged parallel to the word lines, as illustrated in FIG. 20.

Diodes 1110, 1111, 1112, 1113 are connected between the strings and corresponding bit lines in this example.

Ground select transistors 1190, 1191 are arranged at the opposite ends of the NAND strings and are used to couple the NAND strings in a selected layer to a common source reference line. The common source reference lines are decoded by the plane decoder in this structure. The ground select signal GSL can be implemented in the same manner as the conductive lines 1160, 1161 and 1162. The string select transistors and ground select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors. A description of a programming operation is provided, where the target cell is cell A in FIG. 21, and the program disturb conditions are considered for cell B, representing cells on the same plane/source line and the same row/word line but different column/bit line as the target cell, for cell C, representing cells on the same row/word line and a same column/bit line but different plane/source line as the target cell, for cell D, representing cells on the same row/word line as the target cell but on a different column/bit line and a different plane/source line than the target cell, and for cell E, representing cells on the same plane/source line and same column/bit line but different row/word line as the target cell.

According to this arrangement, the string select and common source select lines are decoded on a cube by cube basis. The word lines are decoded on a row by row basis. The common source lines are decoded on a plane by plane basis. The bit lines are decoded on a column by column basis.

Figure 22:
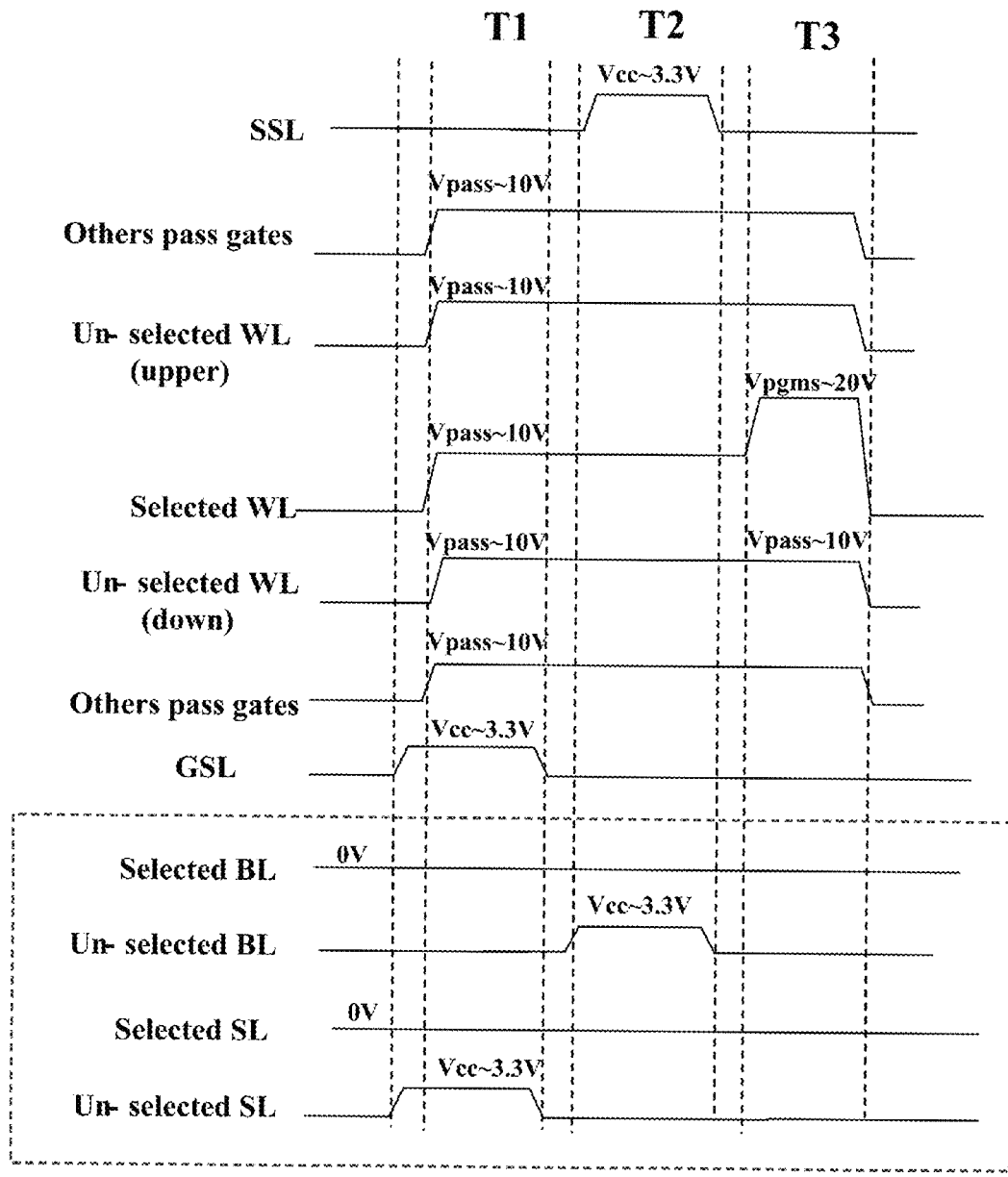
FIG. 22 is a timing diagram for a programming operation in an array like that of FIG. 21.

FIG. 22 is a timing diagram for a programming operation in an array like that of FIG. 20. The program interval is divided into three primary segments labeled T1, T2 and T3. During the first part of T1, the ground select line GSL and the unselected common source lines CSL (shown in the diagram as source line SL) for the cube are set to VCC, which can be about 3.3 V while the selected common source line CSL (shown in the diagram as source line SL) is left at 0 V. Also the string select line for the cube is left at about 0 V. This has the effect of coupling the selected plane to 0V and the unselected planes are left floating, as the difference between unselected common source lines and common source select lines is insufficient to turn on the common source select gates. After a small transition interval, the unselected word lines and any other pass gates (e.g. dummy word lines and select gates) in the circuit are coupled to a pass voltage level which can be about 10 V. Likewise the selected word line is coupled to, or close to, the same voltage, while the ground select line GSL and unselected common source lines CSLs (shown in the diagram as source line SL) remain at VCC. This has the effect of self-boosting the body regions for unselected planes in the cube. With reference to FIG. 21, cells C and D have boosted channel regions as a result of this operation during segment T1.

During segment T2, the ground select line GSL and the unselected common source lines CSL transition back to 0 V, while the word lines and pass gates remain at the pass voltages. A short time after the transition back to 0 V for the ground select line and the unselected common source lines, the string select line for the cube transitions to VCC, which can be about 3.3 V as mentioned above. Likewise, unselected bit lines transition to VCC. As a result of the biasing during segment T2, the channels of the memory cells in the selected plane, selected row and unselected columns (e.g. cell B) and the unselected plane, selected row and unselected columns (e.g. cell D) are boosted by self boosting. The boosted channel voltage of cell C does not leak out due to the diode by the BL. After segment T2, the string select line and the unselected bit lines transition back to 0V.

During segment T3, after the string select line and unselected bit lines settle back to 0 V, the voltage on the selected word line is boosted to a program potential, such as about 20 V, while the string select line, ground select line, selected bit line, unselected bit line, selected common source line and unselected common source line remain at 0 V. An inversion channel is formed in the selected cell during the segments T1 and T2, and therefore programming is accomplished even though the string select gate and common source select date are both off. It is noted that cell E, in the same plane and the same column as the target cell but in a different row, suffers disturb only as a result of the pass voltage being applied to unselected word lines. As a result the pass voltages applied should be low enough to prevent disturbing the data stored in these cells (e.g., <10 V).

At the end of the program interval all of the voltages returned to about 0 V.

Various embodiments of the structure of FIG. 20 employ drain-side (bit line) forward sensing. In various embodiments, the diode suppresses stray current paths during read and program inhibit operations.

A read bias condition suitable for the structure of FIG. 20 is shown in FIG. 23. According to the bias condition of the structure on substrate 410 shown in FIG. 23, a plane of cells in a cube is biased for reading by applying pass voltages to unselected word lines, and a read reference voltage to a selected word line. The selected common source line is coupled to about 0 V, unselected common source line is coupled to about Vcc, while the ground select line GSL and string select line SSL for the cube are both coupled to about 3.3 V. The bit lines for the cube BLn and BLn+1 are coupled to a precharge level about 1.5 V.

Page decoding in this example can be accomplished using the common source line, plane decoding. Thus, for a given read bias condition a page having the same number of bits as there are bit lines can be read for each selected common source line, or plane, in the cube. The selected common source line is grounded or set at a reference voltage, while the other common source lines are set to about 3.3 V. In this manner, the unselected common source lines float. The diodes in the bit line paths for the unselected planes prevent stray current.

In a page read operation, each word line is read one time for each plane in the cube. Likewise, during a program operation operated on a page basis the program inhibit conditions must be sufficient to endure the number of programming operations required for the page, that is one for each plane. Therefore for a cube including eight planes of memory cells, the program inhibit conditions must endure eight cycles of program for unselected cells.

It is noted that the diode in the bit line string requires that the bias on the bit line be increased slightly to compensate for the diode junction drop which is typically about 0.7 V.

Figure 24:
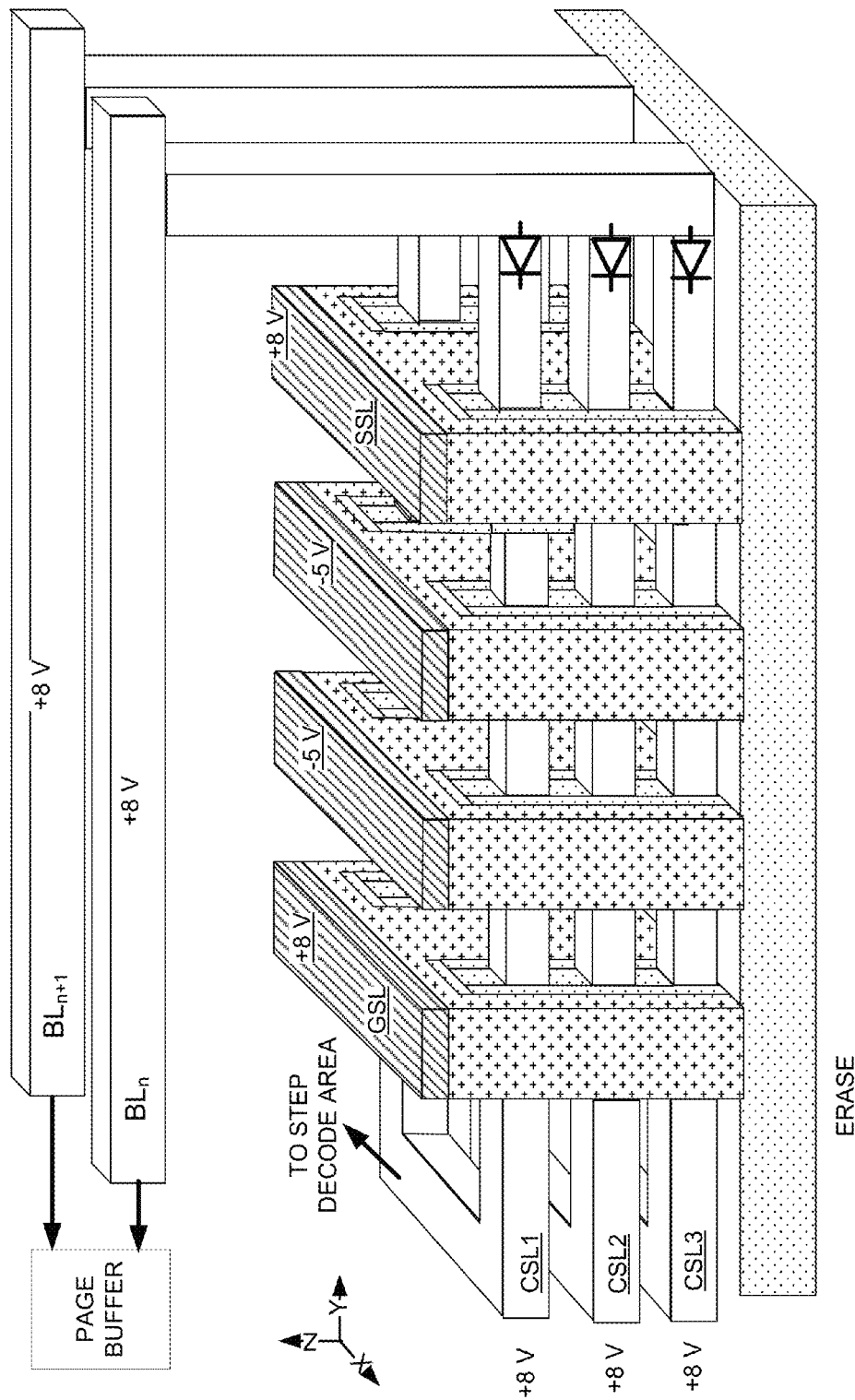
FIG. 24 is a perspective view of a 3D NAND-flash memory structure including diodes in the strings between the bit line structures and the memory strings, undergoing a program operation.

FIG. 24 illustrates the biasing conditions for a cube erase operation. In the arrangement shown in the figure, the word lines are coupled to a negative voltage such as about −5 V, the common source lines and bit lines are coupled to a positive voltage of about +8 V, and the GSL ground select line is coupled to a suitably high pass voltage, such as about +8 V. This helps suppress the punch-through criterion of the source line bias. Other blocks' SSL/GSL are turned off. The high voltage requirement of the BL is satisfied by BL driver design. Alternatively, the word lines and string select line can be grounded while the common source lines and ground select line are coupled to a high-voltage such as 13 V.

Figure 25:
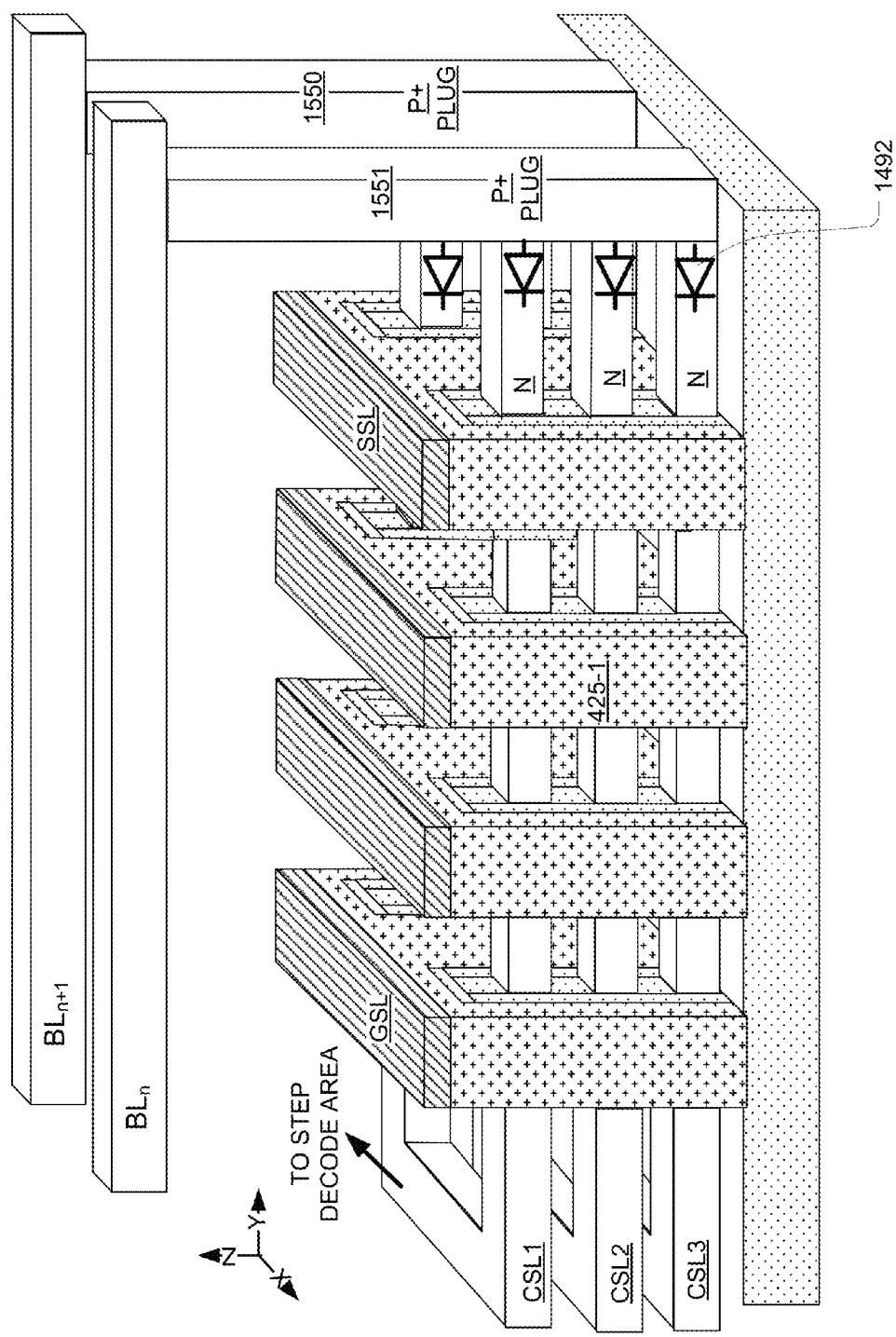
FIG. 25 is a perspective view of a 3D NAND-flash memory structure including diodes in the strings between the bit line structures and the memory strings, with the diodes implemented by polysilicon plugs.

FIG. 25 illustrates an alternative embodiment, where the diodes 1492 are implemented by using a polysilicon plug 1550, 1551 which formed by in situ p+ doping during formation of the plug. In this manner, the diodes are self aligned and manufacturing steps can be reduced. Otherwise the structure is the same as that shown in FIG. 20. A twisted-layout contact structure is used for below 40 nm (See, FIG. 27).

During self-boosting, the PN diodes have to sustain a boosted channel potential ~8V within several tens of microseconds. The estimated leakage current of reverse bias at 8V should be smaller than 100 pA to sustain the boosted potential. Of course, the breakdown should be much higher than 8V. A low turn-on voltage (e.g., <0.7V) helps prevent sensing difficulties.

Figure 26:
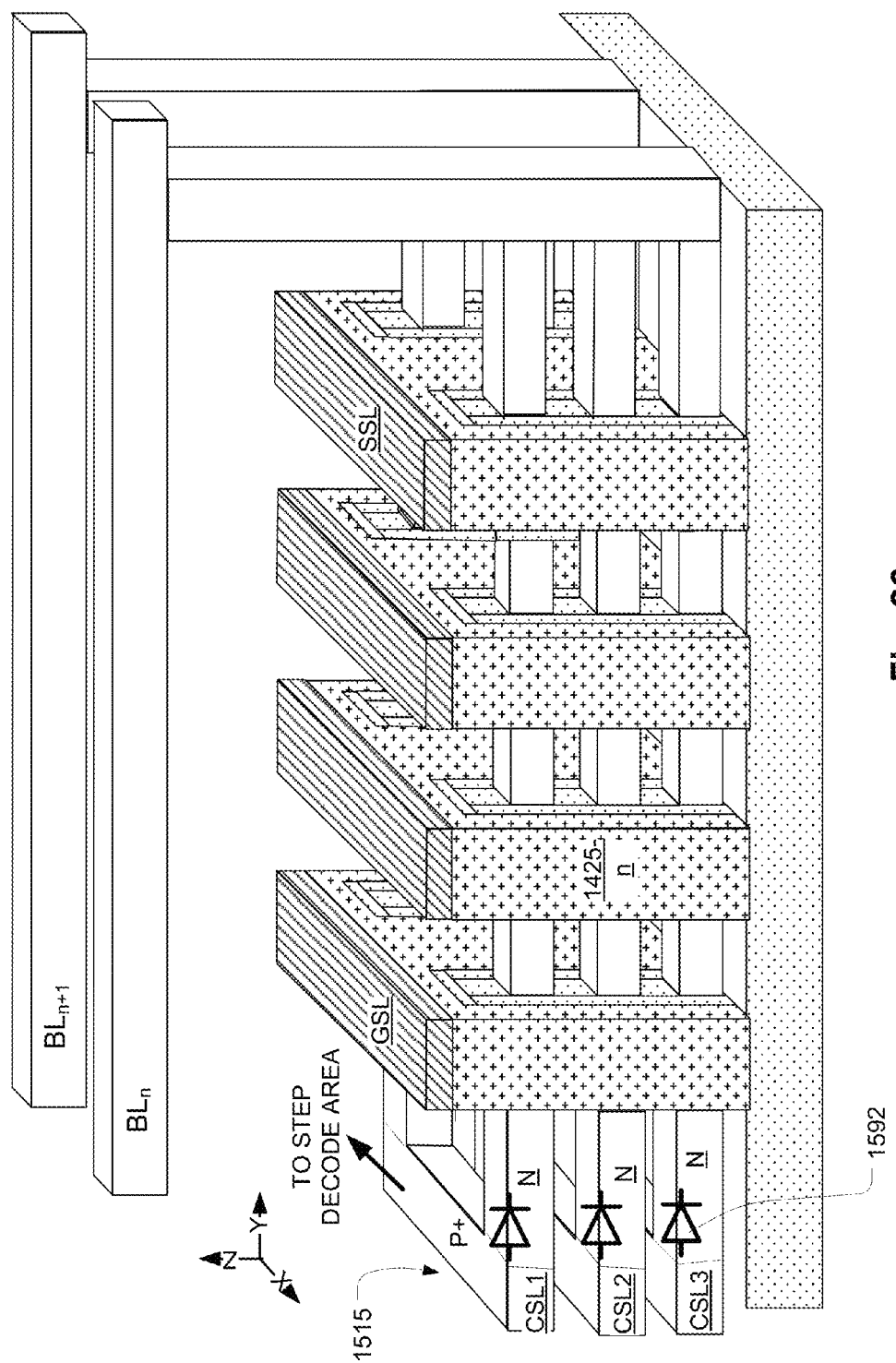
FIG. 26 is a perspective view of a 3D NAND-flash memory structure including diodes in the strings between the source line structures and the memory strings.

FIG. 26 illustrates an alternative implementation away which the diodes are positioned on the common source line end of the strings of memory cells. Thus, in the region 1515 the source lines in each plane are coupled together by a P+ line or implants, forming PN diodes on each string of lines between the common source line decoder and the ground select line GSL. Otherwise the structure is similar to that of FIG. 20.

Various embodiments of the structure of FIG. 26 employ source-side (source line) reverse sensing. In various embodiments, the diode suppresses stray current paths during read and program inhibit operations.

Figure 27:
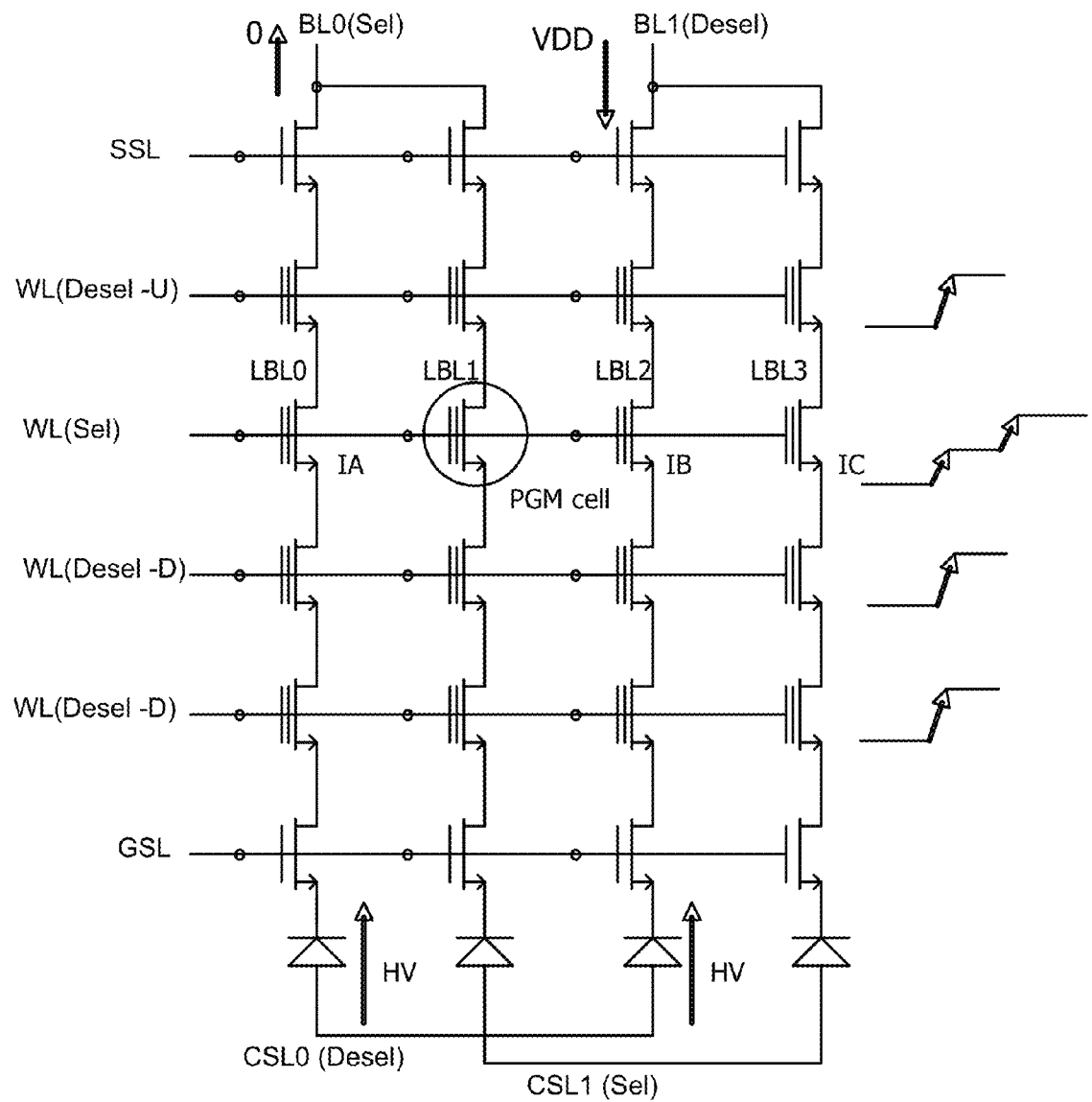
FIG. 27 is a schematic diagram of a 3D NAND-flash memory structure including diodes in the strings between the source line structures and the memory strings, showing 2 planes of memory cells.

FIG. 27 is a schematic diagram of a cube, showing two planes of cells, corresponding to the common source line CSL0 and common source line CSL1, two columns of cells corresponding to the bit line BL0 and bit line BL1 and four rows of cells corresponding to the word lines shown in the diagram. A string select line SSL is coupled to string select gates for the cube, and a ground select line GSL coupled to common source of select gates for the cube. A self boosting program operation similar to that described above is used for programming, with a two-stage programming voltage applied to the selected word line as described in more detail below. Diodes are coupled between the common source line CSL0 and common source line CSL1 and the corresponding strings of cells.

In the following discussion, local bit line is used as another term for a string. In this structure, all CSL can apply high voltage for program inhibit. When selected CSL goes low, the local bit line high voltage won't go low. A page buffer can determine which cell should be programmed. When BL voltage is VDD, no programming happends. When BL voltage is GND, then programming occurs.

For a NAND flash cell, Fowler Nordheim tunneling is used to program the selected cell. To inhibit programming of the deselected cell, a high-voltage should be applied to the local bit line or channel of the cells. To achieve programming with inhibit, programming sequences such as those shown in FIGS. 28 and 29 can be applied.

The program operation includes applying high-voltage to unselected common source lines, and VCC (about 3.3 V) to unselected bit lines. The local bit line for the unselected bit lines will boost to high-voltage when the word line goes to a pass voltage of the VCC or high-voltage. The local bit line of the selected bit line will be forced to high-voltage by the common source select line or pulled down to ground by the bit line. When the word line of the selected cell goes to the program potential, all of the local bit lines are floating. The power applied during the operation should be sufficient that any fighting current (from VCC/high voltage to ground) caused by the voltage level on a local bit line on a deselected bit line does not impact the program or cause program disturb conditions.

Figure 28:
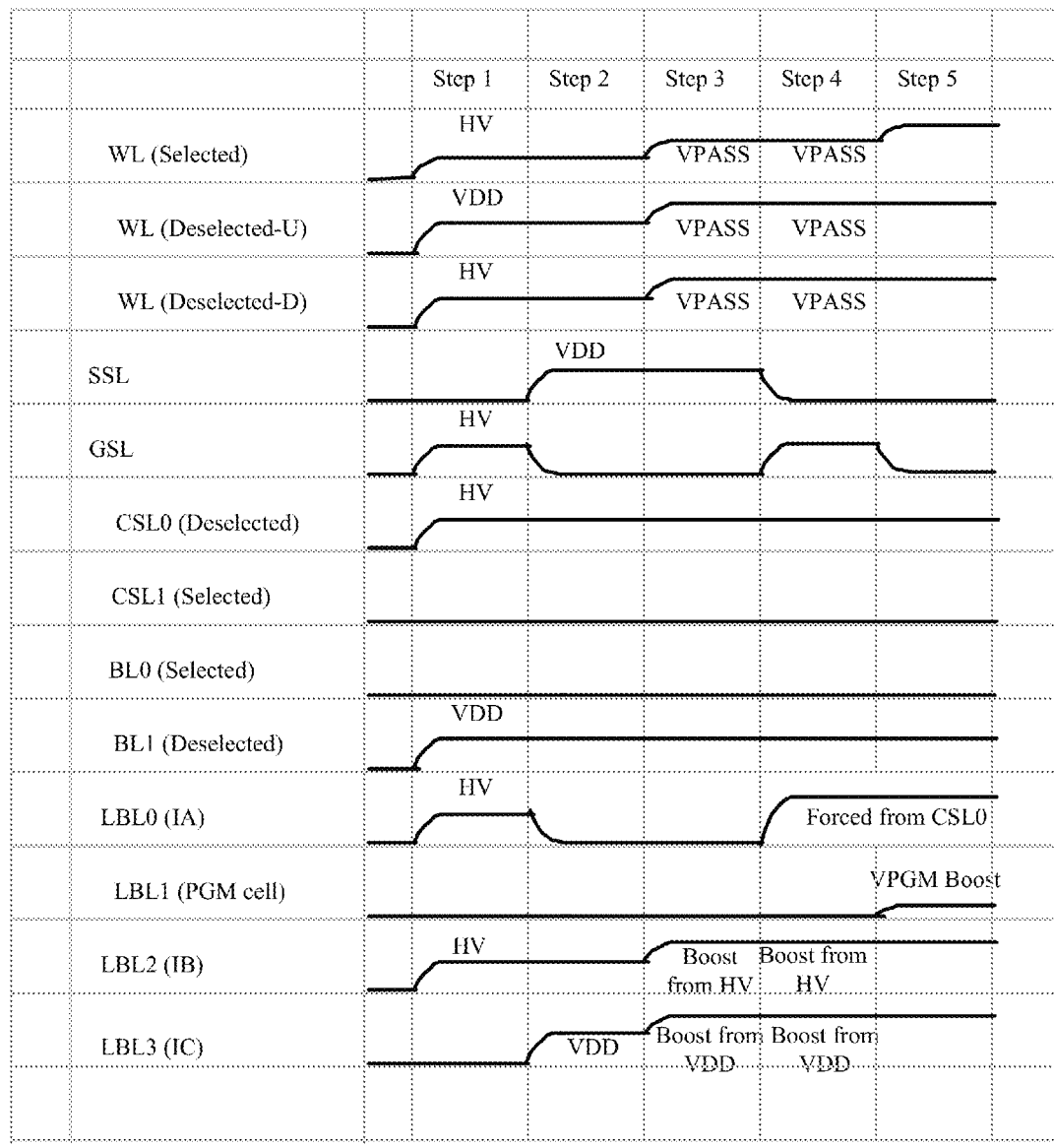
FIG. 28 is a timing diagram for a first example of a programming operation in an array like that of FIG. 27.

FIG. 28 shows a five-step sequence to accomplish programming. In step number one, the ground select line turns on the ground select gates, while the string select line turns off the string select gate. High voltage on the unselected common source line charges the local bit lines of unselected planes in the cube to high-voltage. The word line voltages for all the word lines are stepped to a first word line level. In the second step, the local bit line on the unselected columns are charged to VCC, by turning on the string select gate and turning off the ground select gate while applying the supply potential to the unselected bit line and ground to the selected bit line. In the third step, the word lines are biased to a next pass voltage level while the string select gate remains on and the ground select gate remains off. This causes the local bit line on unselected local bit lines to couple to high-voltage. In step four, local bit lines which share the selected bit line and a deselected common source line, are charged to high-voltage. In this stage, the string select line is off, and the ground select line is on. In step five, the word line voltages biased to a program voltage while the string select line and the ground select line remain off.

Figure 29:
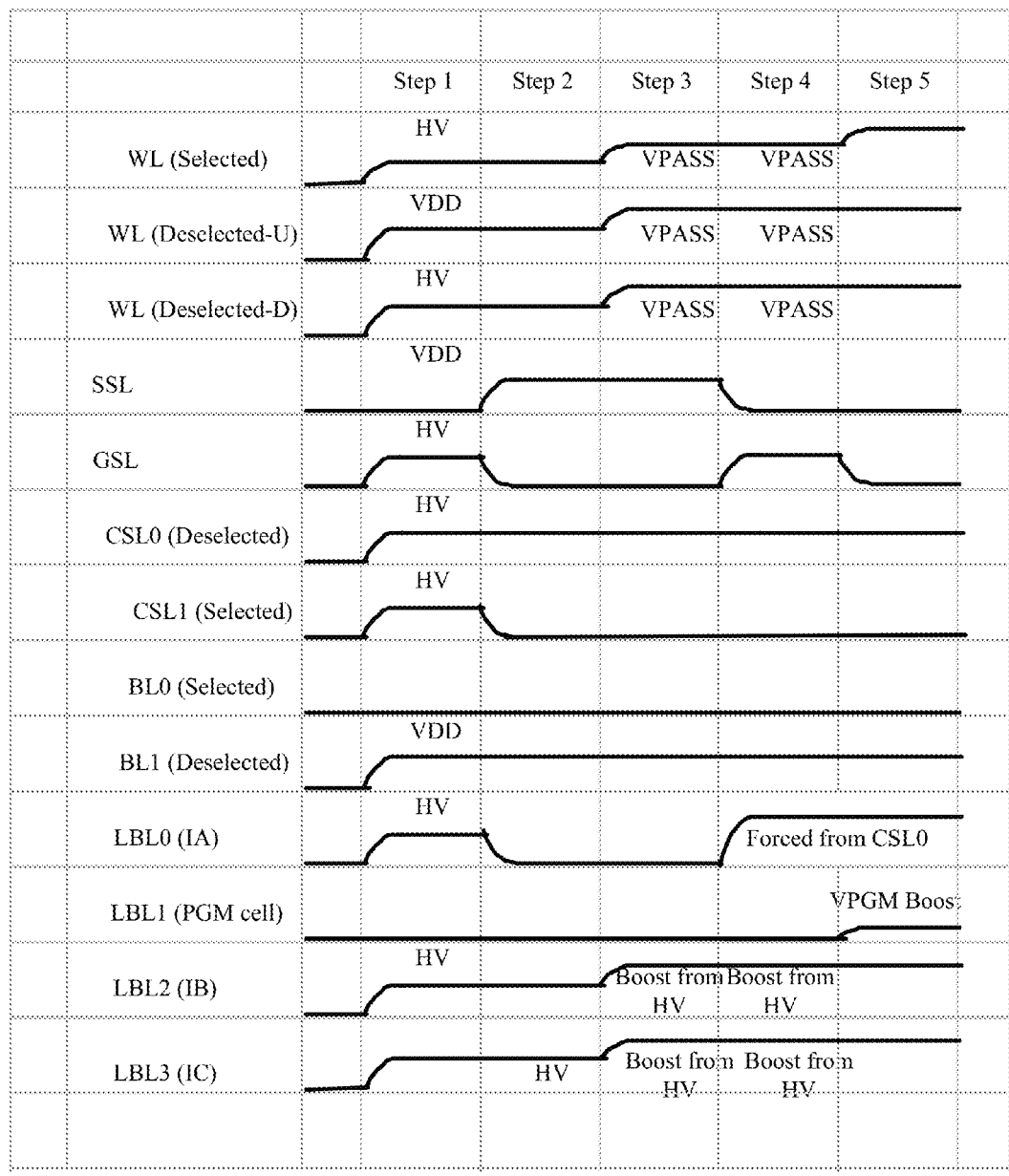
FIG. 29 is a timing diagram for a second example of a programming operation in an array like that of FIG. 27.

FIG. 29 shows an alternative five-step sequence. In step 1, all the local bit lines are charged to high-voltage through the common source line by biasing the common source lines of the cube to high-voltage, turning on the ground select gate GSL and turning off the string select gate SSL for the cube. Next on the ground select is turned off and the string select gate is turned on for the cube, which drives the local bit line on the selected local bit line to ground voltage.

In the third step, the word lines are driven to a pass voltage while the string select gate and ground select gate remain off. The local bit lines on the selected bit line remain grounded and the local bit lines on the unselected bit lines float and are boosted from the word lines. In the fourth step, local bit line on the selected bit line and unselected common source line are charged to high-voltage by biasing on the unselected common source lines by turning on the ground select gate and turning off the string select gate. In the fifth step, the selected word line receives the program voltage while both the string select gate and ground select gates are off. The algorithm of FIG. 29 compared to that of FIG. 28 may have better boost inhibit characteristics while consuming more power. Improved boost inhibit results from boosting LBL3 from high voltage, such that the LBL voltage is higher, improving inhibit. Increased power consumption results from CSL going to high voltage, and discharging to ground.

Thus, in this operating technique, high voltage is applied from the source line for program inhibit. The programmed bit line is floating when the program voltage is applied to the selected bit line with the unselected source line being pulled ground. Also, the sequence of bias voltages is applied in a manner to maintain proper boosting for program inhibit. It diode in the current path prevents current flow back to the common source during the programming.

Because CSL is global, CSL can be decoded once for the whole array. In contrast, decoding SSL can require extra SSL drivers and contact area.

In various embodiments, the diode-decoded memory array decreases the number of SSL string select line gates to one SSL string select line structure per block, or one SSL string select line gate per NAND string. This structure greatly relieves processing difficulty, and is highly symmetrical and scalable. This architecture does not require a larger number of SSLs string select lines when increasing the number of memory cell layers in the 3D memory array. Similarly, one GSL ground select line is sufficient in one block.

The 3D Vertical Gate (VG) device is best used by TFT BE-SONOS device. On the other hand, it is possible to develop other similar devices using anti fuses or other memory technology (such as using some other charge-trapping devices with high-K top dielectric).

Figure 30:
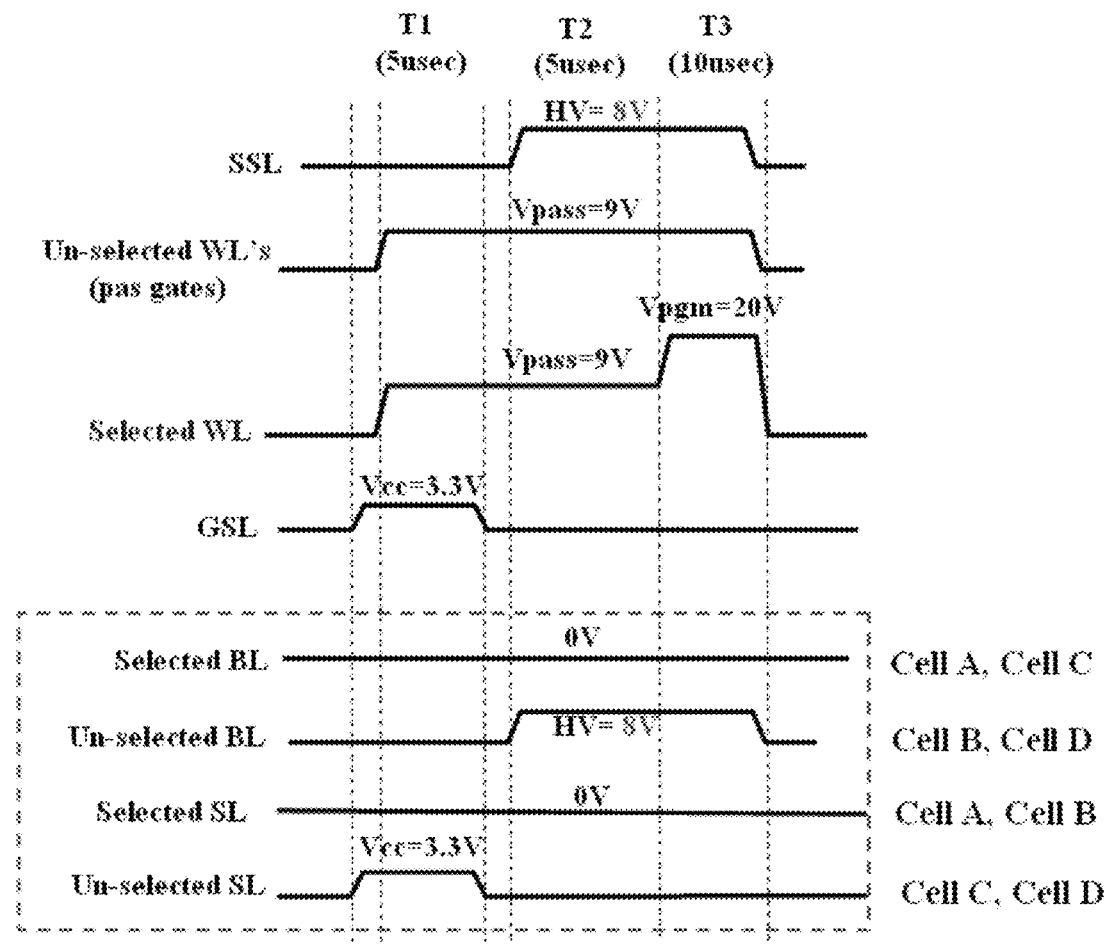
FIG. 30 is a timing diagram for a further example of a programming operation in an array like that of FIG. 21.

FIG. 30 is a timing diagram for a further example of a programming operation in an array like that of FIG. 21.

During time phase T1, the source line is self-boosted by Vcc on the GSL ground select line unselected SLs source lines.

During time phase T2, the un-selected BLs bit lines are raised to HV high voltage by the HV high voltage on the SSL string select line and on un-selected BLs bit lines. The Vch channel voltage is raised for cell B. The boosted Vch channel voltage of cell C does not leak out, due to the diode at the BL bit line.

During time phase T3, cell A is programmed. The inversion channel was already formed during time phase T1.

Figure 31:
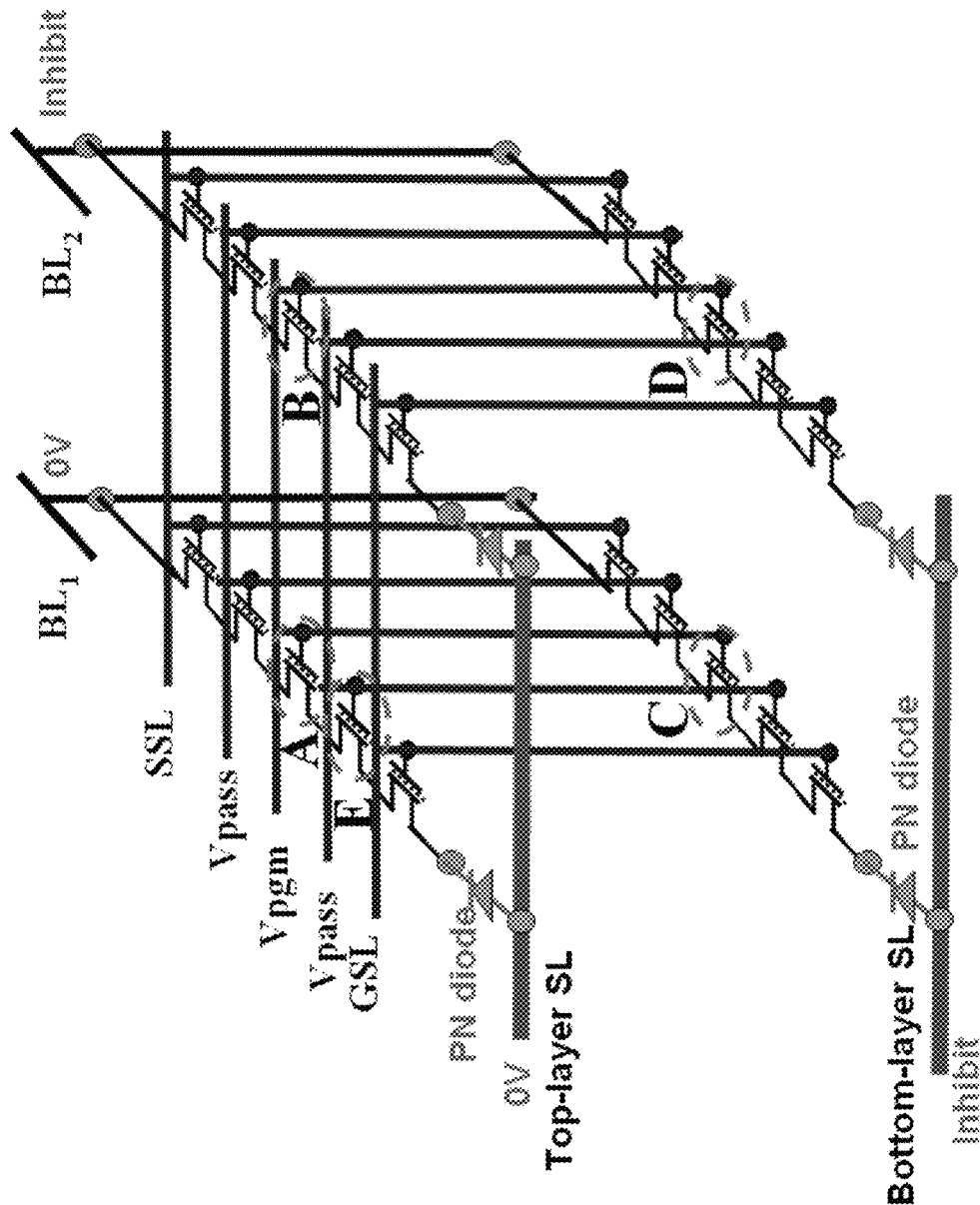
FIG. 31 is a three-dimensional schematic diagram of a 3D NAND-flash memory structure of FIG. 27 including diodes in the strings between the source line structures and the memory strings.

FIG. 31 is a three-dimensional schematic diagram of a 3D NAND-flash memory structure of FIG. 27 including diodes in the strings between the source line structures and the memory strings. This diode position supports program inhibit.

The target cell is cell A. The program disturb conditions are considered as follows: for cell B, representing cells on the same plane/source line and the same row/word line but different column/bit line as the target cell, for cell C, representing cells on the same row/word line and a same column/bit line but different plane/source line as the target cell, for cell D, representing cells on the same row/word line as the target cell but on a different column/bit line and a different plane/source line than the target cell, and for cell E, representing cells on the same plane/source line and same column/bit line but different row/word line as the target cell. Cell E is Vpass disturb and is negligible in many embodiments.

Figure 32:
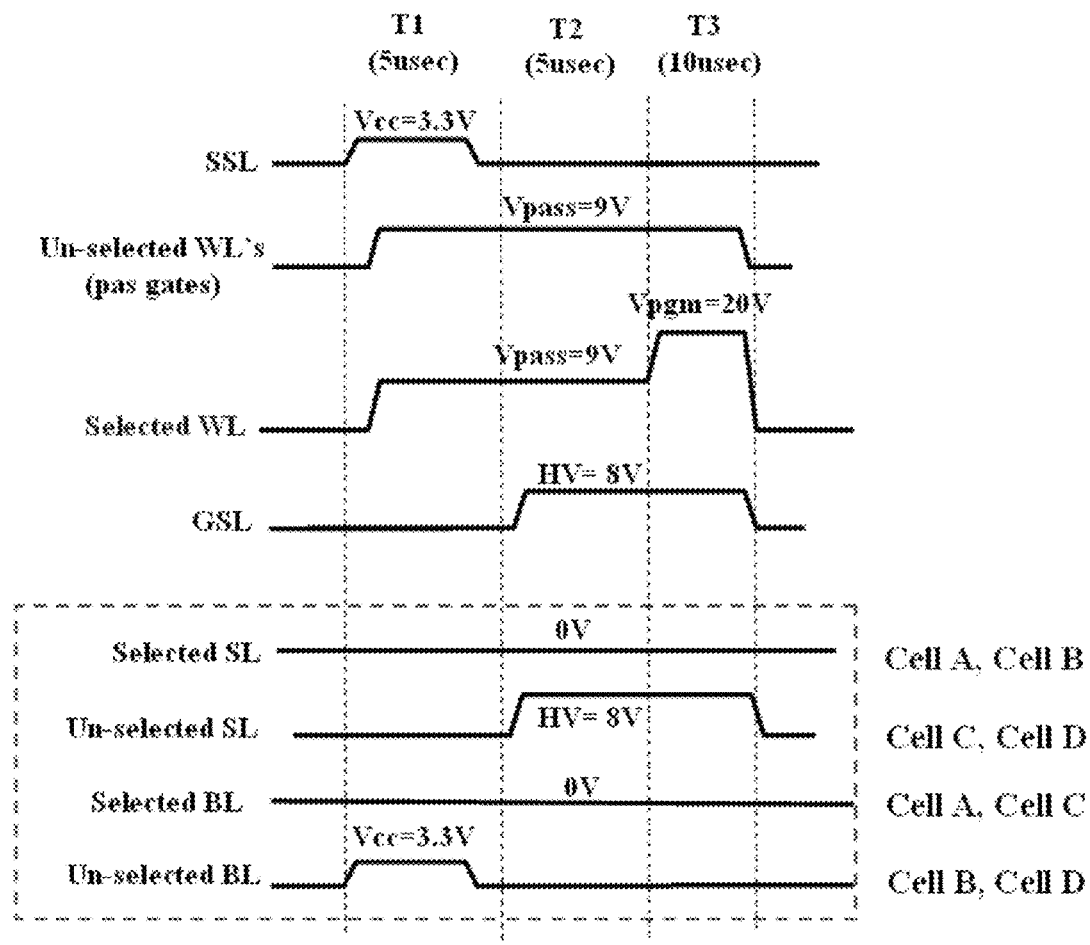
FIG. 32 is a timing diagram for an example of a programming operation in an array like that of FIG. 31.

FIG. 32 is a timing diagram for an example of a programming operation in an array like that of FIG. 31.

During time phase T1, unselected BLs bit lines are self-boosted (cells B and D) by Vcc voltage on SSL string select lines and unselected BLs bit lines.

During time phase T2, the unselected SLs source lines are raised to HV high voltage by the HV high voltage on the GSL ground select line and un-selected SLs source lines. The Vch channel voltage is raised directly for unselected SLs source lines such as cell C. The already boosted Vch channel voltage of cell B does not leak out, due to the diode at the SL source line which is reverse-biased with low leakage, when source line SL=0V and GSL ground select line is turned on.

During time phase T3, cell A is programmed despite SSL string select line being turned off. The inversion channel was already formed during time phase T1.

Figure 33A:
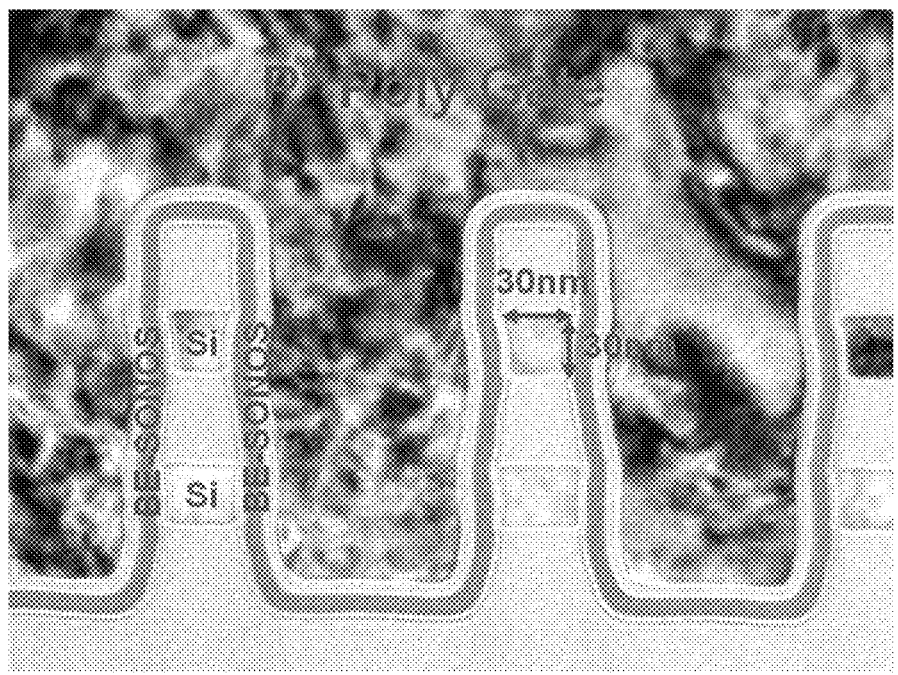
FIGS. 33A and 33B are transmission electron microscope TEM images of a portion of 3D NAND-flash memory array.
Figure 33B:
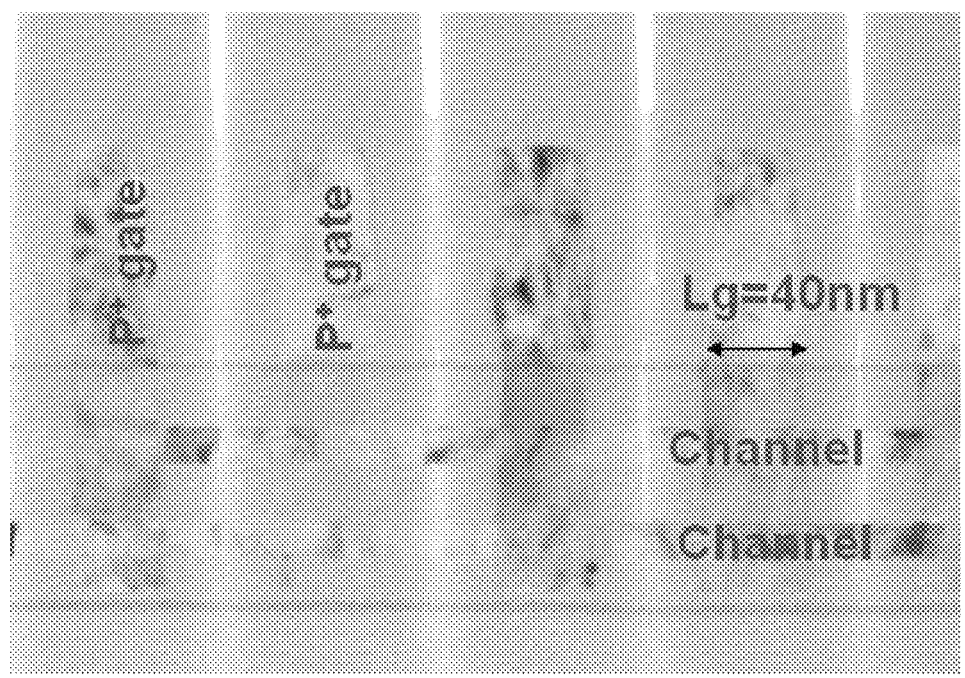

FIGS. 33A and 33B are transmission electron microscope TEM images of a portion of 3D NAND-flash memory array.

Shown are the TEM pictures of the 75 nm half pitch (4F2) VG devices. The channel width and length are 30 and 40 nm, respectively, while channel height is 30 nm. Each device is a double-gate (vertical gate) horizontal-channel device, where channel doping is lightly-doped n-type (buried-channel device) in order to increase the read current. The BL bit line profile is optimized to make a planar ONO topology. A small sidewall recess is obtained by optimizing the processing. Very planar ONO is deposited at the sidewall of BL bit line.

FIG. 33A is an X-direction cross-sectional view of the array. Charge-trapping BE-SONOS devices are grown on the two sides of each channel. Each device is a double-gate device. Channel current flows horizontally, while the gate is vertically common. The sidewall ONO recess is minimized.

FIG. 33B is a Y-direction cross-sectional view of the array. Due to the tight pitch and small bit line (BL) width, the FIB focused ion beam TEM transmission electron microscopy image shows double images including poly gate landing at the BL's line (horizontal semiconductor strip) and space. The channel length is around 40 nm in the shown device.

Figure 34:
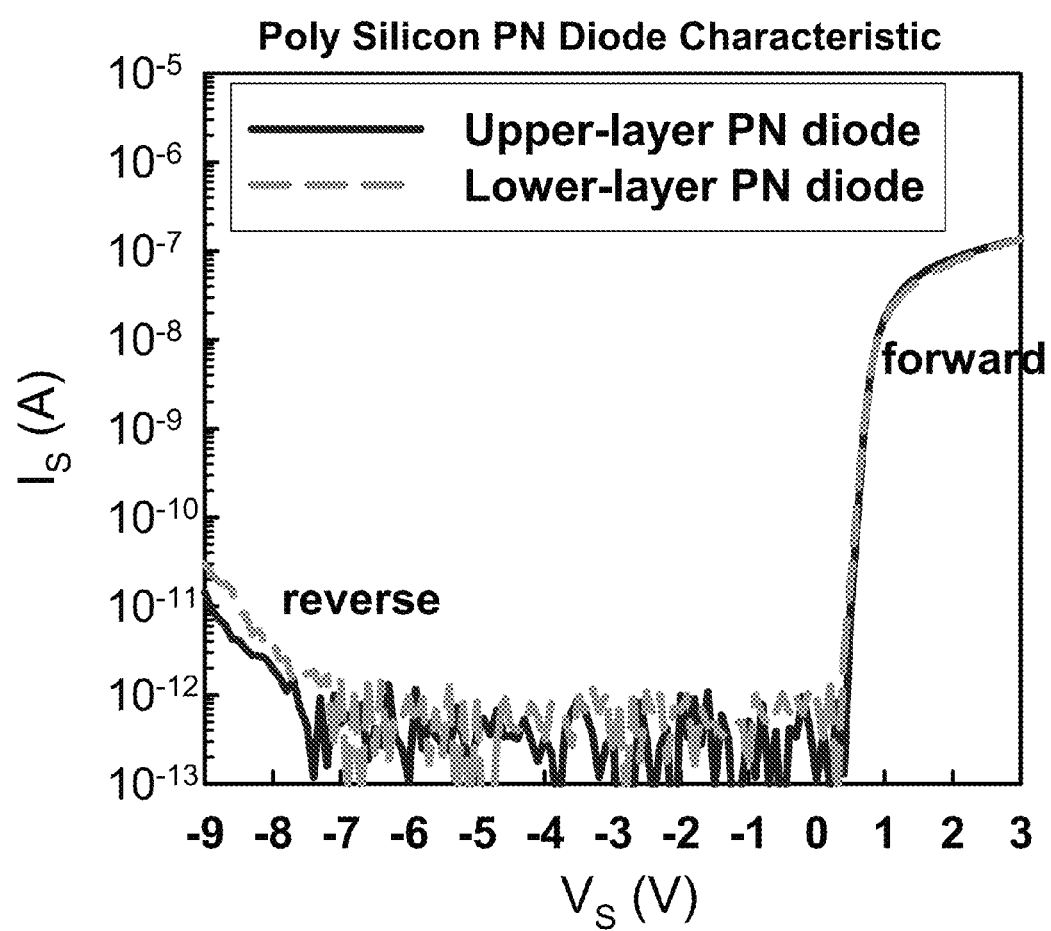
FIG. 34 is a graph of IV characteristics of experimentally measured polysilicon diodes.

FIG. 34 is a graph of IV characteristics of experimentally measured polysilicon diodes.

The forward and reverse IV characteristic of polysilicon PN diodes are measured directly in the PN diodes connected in the VG NAND vertical gate 3D NAND array. The polysilicon height/width dimensions are 30 nm/30 nm. The reverse leakage is much lower than 10 pA at −8V, which is already sufficient for the self-boosting requirement and helps eliminate the program disturb. The source bias Vs is applied, and the Vpass pass voltage of 7V is applied to all WLs word lines. The P+-N diode (30 nm width and 30 nm height) shows successful ON/OFF ratio of more than 6 orders. The forward current is clamped by the NAND string serial resistance.

Figure 35:
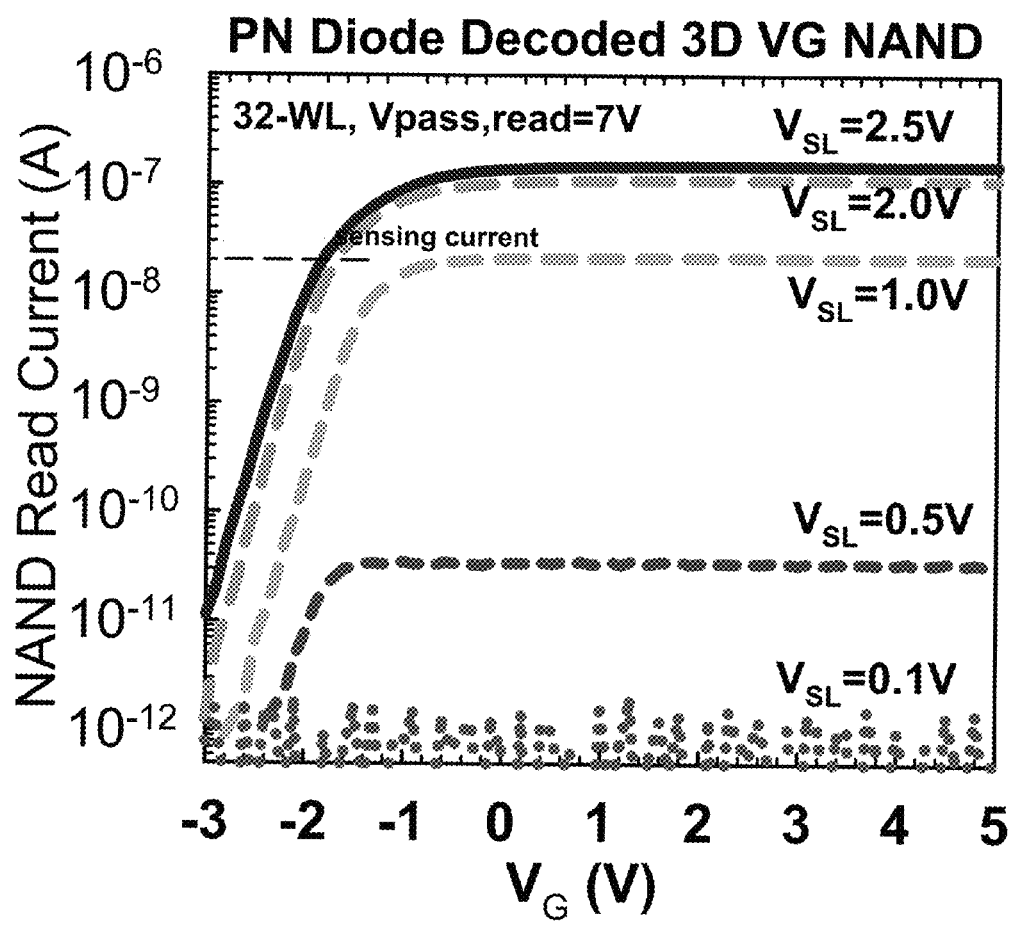
FIG. 35 is a graph of read currents of experimentally measured polysilicon diode connected 3D NAND memory.

FIG. 35 is a graph of read currents of experimentally measured polysilicon diode connected 3D NAND memory.

The 3D NAND memory has 32 WLs word lines. Both the Vpass and Vread voltage of the WLs word lines is 7V. The Vsl source line voltage is varied from the following voltages: 2.5V, 2.0V, 1.0V, 0.5V, and 0.1V. In the graph, the source line voltage of over 1.0V results in adequate sensing current. Read bias is applied at the source side (source-side sensing technique), in this case a positive voltage. The required bias is raised by the PN diode which requires sufficient turn-on voltage, such that over 1.5V source bias results in sufficient read current.

Figure 36:
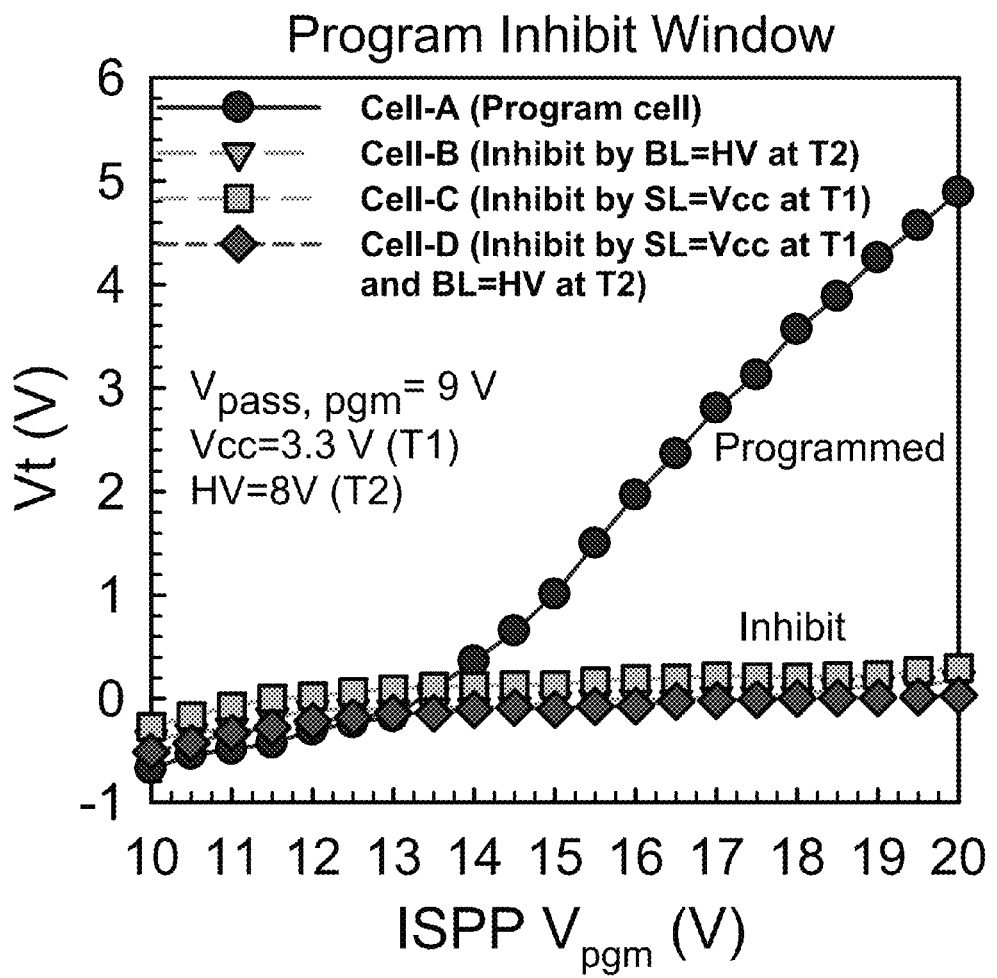
FIG. 36 is a graph of the program inhibit characteristic of experimentally measured polysilicon diode connected 3D NAND memory.

FIG. 36 is a graph of the program inhibit characteristic of experimentally measured polysilicon diode connected 3D NAND memory.

Typical program inhibit characteristics of Cells A, B, C, D are shown. Vcc=3.3V, HV=8V, Vpass=9V in this case. The ISPP (with stepping bias) method is applied at Cell A. The graph shows a disturb-free window larger than 5V. This is a product of the diode isolation property.

Figure 37:
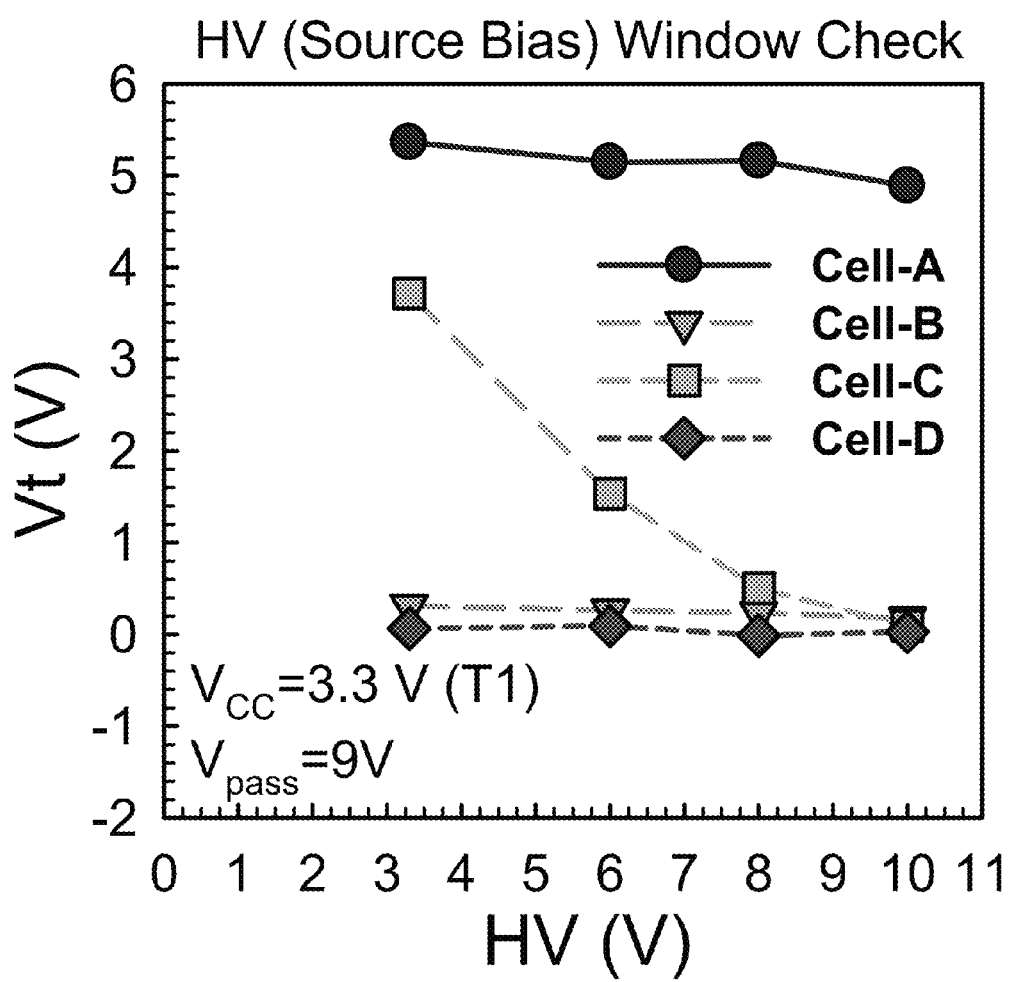
FIG. 37 is a graph of the source bias effect on program disturb of experimentally measured polysilicon diode connected 3D NAND memory.

FIG. 37 is a graph of the source bias effect on program disturb of experimentally measured polysilicon diode connected 3D NAND memory.

Source line inhibit bias (HV) has an effect on the program disturb window. Cell C disturb is minimized by HV>7V.

Figure 38:
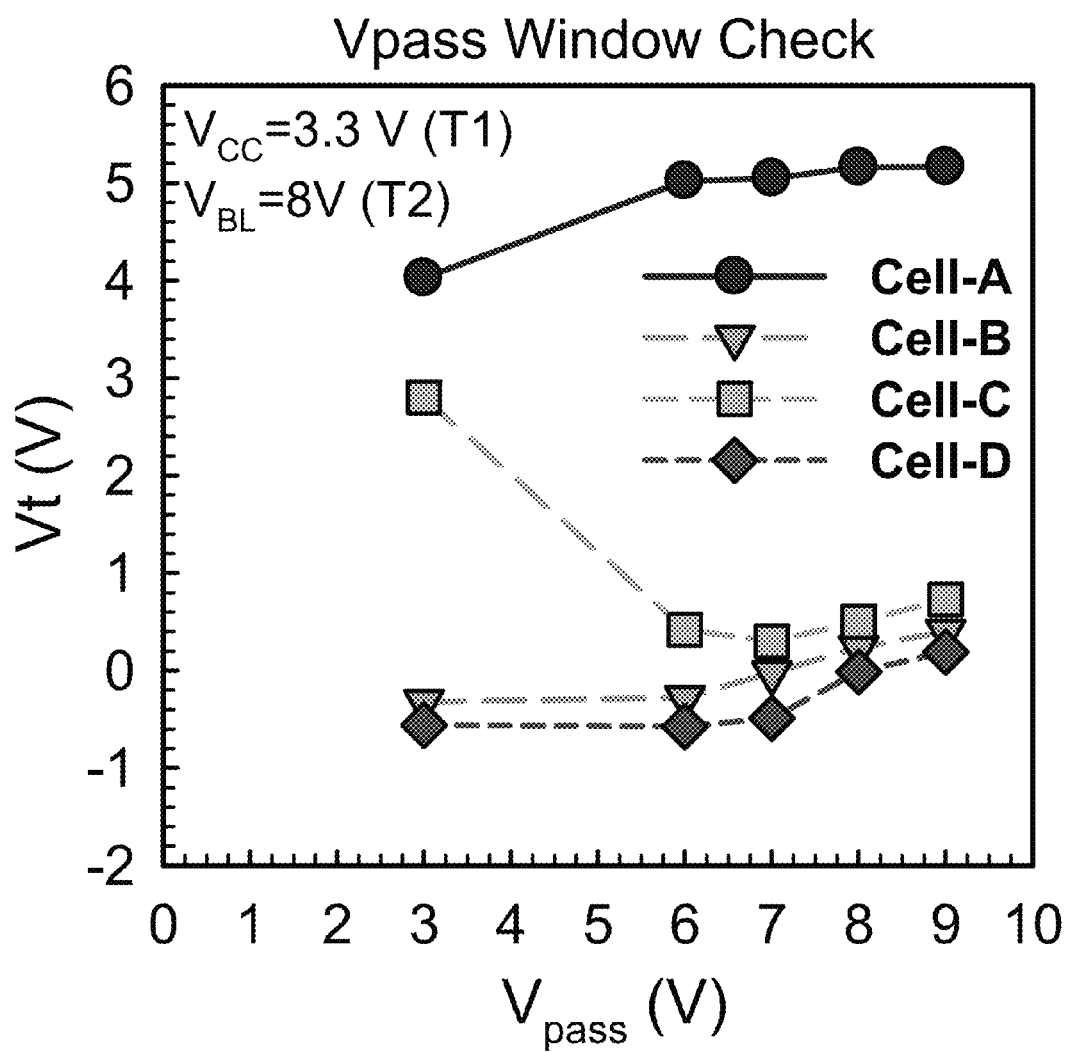
FIG. 38 is a graph of the pass gate voltage effect on program disturb of experimentally measured polysilicon diode connected 3D NAND memory.

FIG. 38 is a graph of the pass gate voltage effect on program disturb of experimentally measured polysilicon diode connected 3D NAND memory.

Pass-gate voltage has an effect on the program disturb. Cell C disturb is reduced by Vpass>6V.

Figure 39:
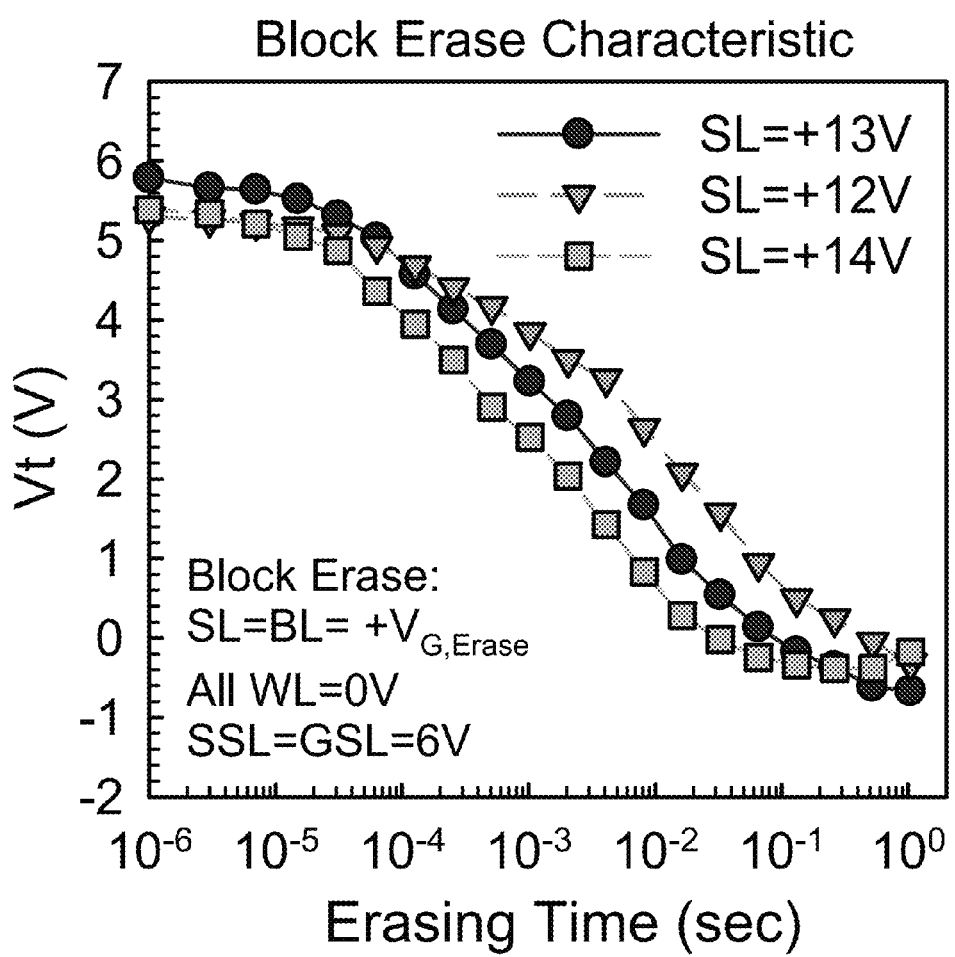
FIG. 39 is a graph of the block erase transient current of experimentally measured polysilicon diode connected 3D NAND memory.

FIG. 39 is a graph of the block erase transient current of experimentally measured polysilicon diode connected 3D NAND memory.

Various biases on the SL source line change the block erasing transient. Erase is carried out by applying a positive source line bias while all word lines WL's are grounded. This is in view of the floating body of the 3D NAND array. SSL/GSL are applied a suitable positive voltage to avoid disturb. The erase transient is shown in FIG. 10. In some embodiments the array does not utilize the field enhancement effect (due to the planar ONO), such that the erase is mainly supported by the BE-SONOS's hole tunneling injection.

Figure 40:
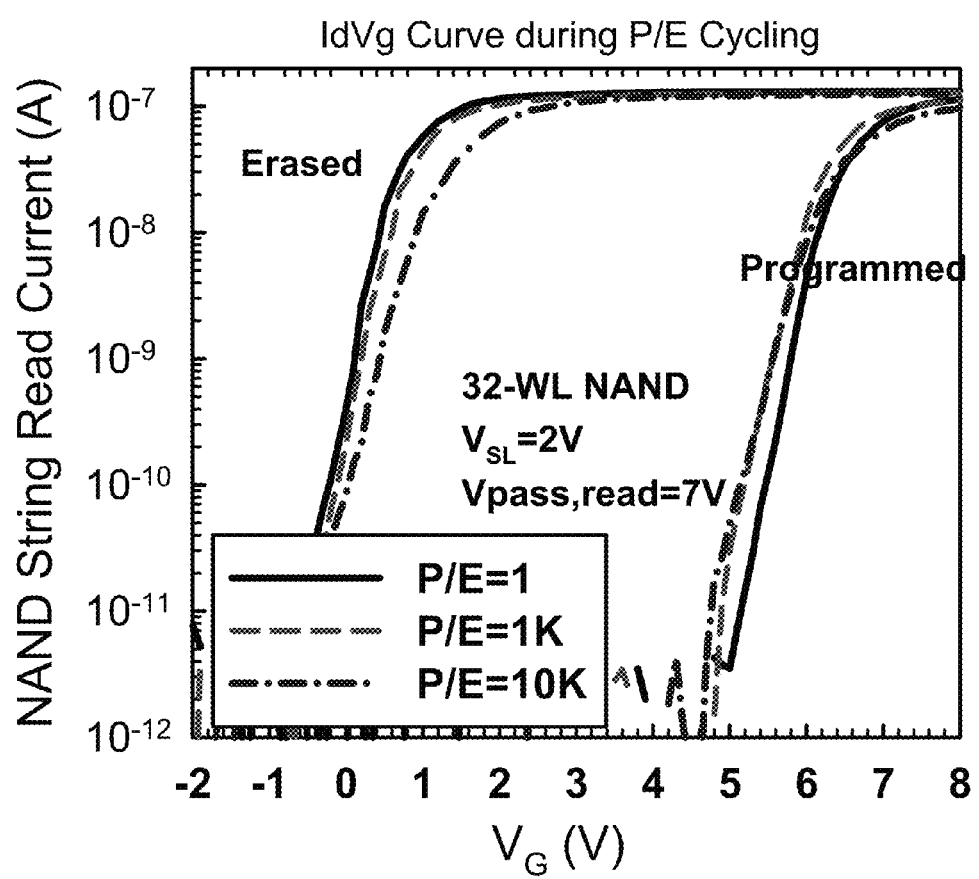
FIG. 40 is a graph of the IV characteristics of programmed and erased states for experimentally measured polysilicon diode connected 3D NAND memory having various numbers of program/erase cycles.

FIG. 40 is a graph of the IV characteristics of programmed and erased states for experimentally measured polysilicon diode connected 3D NAND memory having various numbers of program/erase cycles.

The IV curves show small degradation below 10K cycling stress, particularly at 1 k cycles and 1 cycle. Endurance degradation is often related to the interface state (Dit) generation so that subthreshold slope is degraded, while the memory window is not degraded. By optimizing the BE-SONOS stacks the devices show reasonably small degradation after 10K cycling, comparable to the bulk devices.

Figure 41:
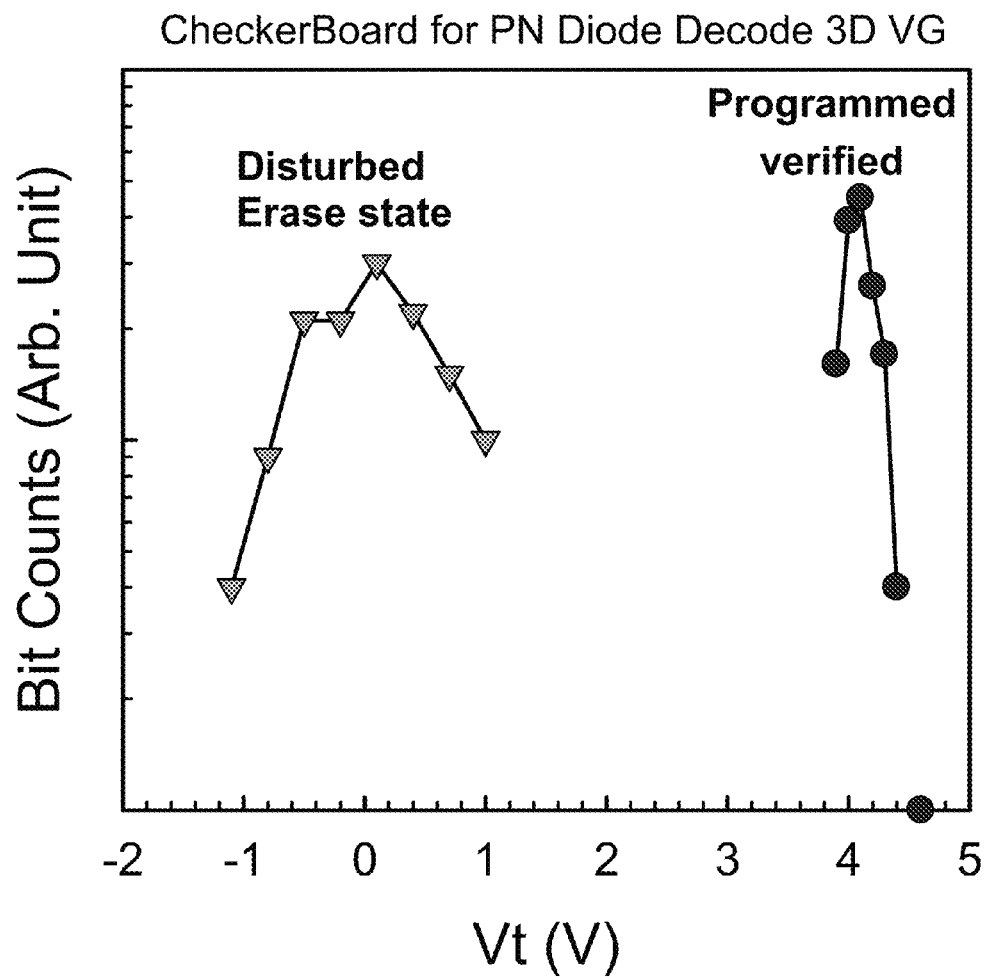
FIG. 41 is a graph of threshold voltage distribution for experimentally measured polysilicon diode connected 3D NAND memory having a checkerboard distribution of programmed/erased memory cells.

FIG. 41 is a graph of threshold voltage distribution for experimentally measured polysilicon diode connected 3D NAND memory having a checkerboard distribution of programmed/erased memory cells.

A SLC (single level cell) checkerboard CKB distribution was used for the PN diode decoded 3D memory array. Nearest neighbor (in the 3-dimensional sense) cells were programmed to the opposite state for the worst-case disturb. Conventional page programming and program inhibit (Cell B conditions) methods are carried out in each layer, and then the other unselected source lines (Cell C and D) inhibited. Page programming is conducted on the other layers subsequently. Unselected cells suffer many sources of row stress and column stress in a 3D array.

In various embodiments, in alternative embodiments the diode is connected at the drain side (BL bit line) or the source side (SL source line), with switched roles of SSL string select line/GSL ground select line and BL bit line/SL source line. These alternative operations are verified in the device level. However, in circuit design, the source line has much lower capacitance loading, such that thus applying high voltage HV at the source line SL is more beneficial in terms of speed and power consumption.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an integrated circuit substrate;
a plurality of stacks of semiconductor material strips on the integrated circuit substrate, the plurality of stacks being ridge-shaped and including at least two semiconductor material strips separated by insulating material into different plane positions of a plurality of plane positions;
a plurality of word lines arranged orthogonally over, and having surfaces conformal with, the plurality of stacks, such that a 3D array of interface regions is established at cross-points between surfaces of the plurality of stacks and the plurality of word lines;
memory elements in the interface regions, which establish a 3D array of memory cells accessible via the plurality of semiconductor material strips and the plurality of word lines, the memory cells arranged in strings between bit line structures and source lines, wherein the strings are NAND strings; and
diodes coupled to the strings, between ends of the strings of memory cells and one of the bit line structures and the source lines.

2. The device of claim 1, wherein a combined selection of a particular bit line of the bit line structures, a particular source line of the source lines, and a particular word line of the plurality of word lines, identifies a particular memory cell of the 3D array of memory cells.

3. The device of claim 1, wherein the diodes are coupled to the strings, between the strings of memory cells and the bit line structures.

4. The device of claim 1, wherein the diodes are coupled to the strings, between the strings of memory cells and the source lines.

5. The device of claim 1, including
a string select line arranged orthogonally over, and having surfaces conformal with, the plurality of stacks, such that the string select devices are established at cross-points between surfaces of the plurality of stacks and the string select line; and
a ground select line arranged orthogonally over, and having surfaces conformal with, the plurality of stacks, such that the ground select devices are established at cross-points between surfaces of the plurality of stacks and the ground select line.

6. The device of claim 5, wherein the diodes are coupled between the string select devices and the bit line structures.

7. The device of claim 5, wherein the diodes are coupled between the ground select devices and the source lines.

8. The device of claim 1, wherein the memory elements in the interface regions respectively comprise a tunneling layer, a charge trapping layer and a blocking layer.

9. The device of claim 1, wherein the semiconductor strips comprise n-type silicon, and the diodes comprise a p-type region in the strips.

10. The device of claim 1, wherein the semiconductor strips comprise n-type silicon, and the diodes comprise a p-type plug in contact with the strips.

11. The device of claim 1, including logic to reverse bias the diodes of unselected strings of memory cells during programming of the memory cells.

12. A memory device, comprising:
an integrated circuit substrate;
a 3D array of memory cells on the integrated circuit substrate, the 3D array including:
stacks of NAND strings of memory cells; and
diodes coupled to the strings, between the strings of memory cells and one of the bit line structures and the source lines; and
a plurality of word lines including at least a first word line that accesses the NAND strings at different levels in the stacks.

13. The device of claim 12, wherein a combined selection of a particular bit line of the bit line structures, a particular source line of the source lines, and a particular word line of the plurality of word lines, identifies a particular memory cell of the 3D array of memory cells.

14. The device of claim 12, wherein the diodes are coupled to the strings, between the strings of memory cells and the bit line structures.

15. The device of claim 12, wherein the diodes are coupled to the strings, between the strings of memory cells and the source lines.

16. The device of claim 12, including:
string select devices between the bit line structures and the strings of memory cells; and
ground select devices between the source lines and the strings of memory cells.

17. The device of claim 16, wherein the diodes are coupled between the string select devices and bit line structures.

18. The device of claim 16, wherein the diodes are coupled between the ground select devices and source lines.

19. The device of claim 12, wherein the memory cells comprise a tunneling layer, a charge trapping layer and a blocking layer.

20. A method of operating a 3D NAND flash memory, including:
applying a program bias arrangement sequence to the 3D NAND flash memory having diodes coupled to the strings such that the diodes are between strings of memory cells and one of bit line structures and source line structures, the 3D NAND flash memory including at least a first word line that accesses the strings of memory cells at different levels in the 3D NAND flash memory.

21. The method of claim 20, wherein applying the program bias arrangement sequence includes:

charging one or more of the unselected strings from one or more of the source line structures through one or more of the diodes, wherein the unselected strings do not include memory cells to be programmed by the program bias arrangement;

decoupling the source line structures and the bit line structures from the unselected strings and a selected string including one or more memory cells to be programmed by the program bias arrangement; and applying a program voltage via one or more word lines of the one or more memory cells to be programmed by the program bias arrangement, to the unselected strings and the selected string.

22. The method of claim 20, wherein applying the program bias arrangement sequence includes:

charging one or more of the unselected strings from one or more of the source line structures not through one or more of the diodes, wherein the unselected strings do not include memory cells to be programmed by the program bias arrangement;

decoupling the source line structures and the bit line structures from the unselected strings and a selected string including one or more memory cells to be programmed by the program bias arrangement; and applying a program voltage via one or more word lines of the one or more memory cells to be programmed by the program bias arrangement, to the unselected strings and the selected string.

23. The method of claim 20, wherein applying the program bias arrangement sequence includes:

charging one or more of the unselected strings from one or more of the bit line structures through one or more of the diodes, wherein the unselected strings do not include memory cells to be programmed by the program bias arrangement;

decoupling the source line structures and the bit line structures from the unselected strings and a selected string including one or more memory cells to be programmed by the program bias arrangement; and applying a program voltage via one or more word lines of the one or more memory cells to be programmed by the program bias arrangement, to the unselected strings and the selected string.

24. The method of claim 20, wherein applying the program bias arrangement sequence includes:

charging one or more of the unselected strings from one or more of the bit line structures not through one or more of the diodes, wherein the unselected strings do not include memory cells to be programmed by the program bias arrangement;

decoupling the source line structures and the bit line structures from the unselected strings and a selected string including one or more memory cells to be programmed by the program bias arrangement; and applying a program voltage via one or more word lines of the one or more memory cells to be programmed by the program bias arrangement, to the unselected strings and the selected string.

\* \* \* \* \*